(12) United States Patent
Kang et al.

(10) Patent No.: US 12,550,747 B2
(45) Date of Patent: Feb. 10, 2026

(54) SEMICONDUCTOR PACKAGE AND METHOD OF FABRICATING THE SAME

(71) Applicant: Samsung Electronics Co., Ltd., Suwon-si (KR)

(72) Inventors: Junghoon Kang, Anyang-si (KR); Jihye Shim, Hwaseong-si (KR); Jung Hyun Lee, Hwaseong-si (KR); Hyunchul Jung, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 674 days.

(21) Appl. No.: 17/858,536

(22) Filed: Jul. 6, 2022

(65) Prior Publication Data

US 2023/0126003 A1    Apr. 27, 2023

(30) Foreign Application Priority Data

Oct. 25, 2021    (KR) .................. 10-2021-0142785

(51) Int. Cl.
*H01L 23/544*    (2006.01)
*H01L 21/56*    (2006.01)
(Continued)

(52) U.S. Cl.
CPC .......... *H01L 23/544* (2013.01); *H01L 21/565* (2013.01); *H01L 23/3178* (2013.01);
(Continued)

(58) Field of Classification Search
CPC ............... H01L 23/544; H01L 23/3178; H01L 23/49811; H01L 23/49822

See application file for complete search history.

(56) References Cited

U.S. PATENT DOCUMENTS 9,343,386 B2    5/2016  Huang et al.
9,343,434 B2    5/2016  Chen
(Continued)

FOREIGN PATENT DOCUMENTS

CN          106158762 A      11/2016
KR    10-2009-0098070 A      9/2009
(Continued)

OTHER PUBLICATIONS

Korean Examination Report dated Aug. 22, 2025 issued in Korean Patent Application No. 10-2021-0142785.

*Primary Examiner* — Trang Q Tran
(74) *Attorney, Agent, or Firm* — Harness, Dickey & Pierce, P.L.C.

(57) ABSTRACT

A semiconductor package including a lower substrate, a lower semiconductor chip mounted on the lower substrate, a lower mold layer on the lower substrate and enclosing the lower semiconductor chip, a redistribution layer on the lower mold layer, and a vertical connection terminal around the lower semiconductor chip and connecting the lower substrate to the redistribution layer may be provided. The lower semiconductor chip may include a cognition mark at a top surface thereof. The cognition mark may include a marking pattern having an intaglio shape at the top surface of the lower semiconductor chip, and a molding pattern filling an inner space of the marking pattern. A first material constituting the molding pattern may be the same as a second material constituting the lower mold layer.

16 Claims, 21 Drawing Sheets

(51) Int. Cl.
*H01L 23/31* (2006.01)
*H01L 23/498* (2006.01)
*H01L 25/10* (2006.01)
*H01L 21/48* (2006.01)
*H01L 23/00* (2006.01)

(52) U.S. Cl.
CPC .. *H01L 23/49811* (2013.01); *H01L 23/49822* (2013.01); *H01L 23/49833* (2013.01); *H01L 23/49838* (2013.01); *H01L 23/49894* (2013.01); *H01L 25/105* (2013.01); *H01L 21/4857* (2013.01); *H01L 21/486* (2013.01); *H01L 23/3121* (2013.01); *H01L 24/16* (2013.01); *H01L 24/48* (2013.01); *H01L 2223/5442* (2013.01); *H01L 2223/54433* (2013.01); *H01L 2224/16227* (2013.01); *H01L 2224/16238* (2013.01); *H01L 2224/48228* (2013.01); *H01L 2225/1023* (2013.01); *H01L 2225/1041* (2013.01); *H01L 2225/1058* (2013.01); *H01L 2924/1811* (2013.01); *H01L 2924/1815* (2013.01); *H01L 2924/182* (2013.01); *H01L 2924/186* (2013.01); *H01L 2924/37001* (2013.01)

(56) References Cited

U.S. PATENT DOCUMENTS

| | | | |
|---|---|---|---|
| 9,589,900 | B2 | 3/2017 | Su et al. |
| 9,665,122 | B2 | 5/2017 | Kwon et al. |
| 9,721,933 | B2 | 8/2017 | Chen |
| 10,068,881 | B2 | 9/2018 | Kwon |
| 10,096,553 | B2 | 10/2018 | Su et al. |
| 10,134,719 | B2 | 11/2018 | Cheng et al. |
| 10,811,352 | B2 | 10/2020 | Jeong |
| 11,373,980 | B2 | 6/2022 | Kim et al. |
| 2011/0291249 | A1 | 12/2011 | Chi et al. |
| 2014/0175657 | A1 | 6/2014 | Oka et al. |
| 2020/0111742 | A1* | 4/2020 | Han ............ H01L 23/3128 |
| 2020/0135656 | A1 | 4/2020 | Zhou et al. |
| 2020/0273806 | A1 | 8/2020 | Chiang et al. |
| 2021/0020608 | A1 | 1/2021 | Kim et al. |
| 2021/0391284 | A1* | 12/2021 | Hsu ............ H01L 23/3128 |
| 2022/0068818 | A1 | 3/2022 | Song et al. |
| 2022/0223564 | A1* | 7/2022 | Chen ............ H01L 25/105 |

FOREIGN PATENT DOCUMENTS

| | | |
|---|---|---|
| KR | 10-2021-0008957 A | 1/2021 |
| KR | 10-2022-0027333 A | 3/2022 |
| KR | 10-2023-0048949 A | 4/2023 |

\* cited by examiner

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2021-0142785, filed on Oct. 25, 2021, in the Korean Intellectual Property Office, the entire contents of which are hereby incorporated by reference.

BACKGROUND

Field

The present disclosure relates to semiconductor packages and/or methods of fabricating the same, and in particular, to semiconductor packages with a cognition mark and/or methods of fabricating the same.

Description of the Related Art

A semiconductor package is configured to easily use a semiconductor chip as a part of an electronic product. In general, the semiconductor package may include a substrate (e.g., a printed circuit board (PCB)) and a semiconductor chip, which is mounted on the substrate and is electrically connected to the substrate using bonding wires to bumps.

With the recent advance in the electronics industry, a demand for high-performance, high-speed, and compact electronic components are increasing. To meet the demand, it is necessary to develop a technology of fabricating a semiconductor device or a semiconductor package having a fast signal transmission property and a small size. For example, it is necessary to develop a technology of packaging a plurality of chips in a single package.

A laser marking process is performed to form a cognition mark in a semiconductor package and is generally performed on a mold layer of a semiconductor chip. In the case where the laser marking is realized using only a laser patterning process, a mark may have a low visibility and a package may suffer from a low stacking yield.

SUMMARY

Some example embodiments of the inventive concepts provide semiconductor packages including a cognition mark with high visibility and/or methods of fabricating the same.

Some example embodiments of the inventive concepts provide methods of fabricating a semiconductor package in a low failure rate and semiconductor packages fabricated thereby.

According to some example embodiments of the inventive concepts, a semiconductor package may include a lower substrate, a lower semiconductor chip on the lower substrate, a lower mold layer on the lower substrate and enclosing the lower semiconductor chip, a redistribution layer on the lower mold layer, and a vertical connection terminal around the lower semiconductor chip and connecting the lower substrate to the redistribution layer. The lower semiconductor chip may include a cognition mark at a top surface thereof. The cognition mark may include a marking pattern at the top surface of the lower semiconductor chip and having an intaglio shape, and a molding pattern filling an inner space of the marking pattern. A first material constituting the molding pattern may be the same as a second material constituting the lower mold layer.

According to some example embodiments of the inventive concepts, a semiconductor package may include a substrate, a semiconductor chip on the substrate, a mold layer on the substrate and enclosing the semiconductor chip, a redistribution layer on the mold layer, and a penetration electrode around the semiconductor chip and connecting the substrate to the redistribution layer. The semiconductor chip may include a cognition mark at a top surface thereof. The cognition mark may include a marking pattern at the top surface of the semiconductor chip, a top surface of the marking pattern being at a level different from the top surface of the semiconductor chip and a molding pattern being on the semiconductor chip and exposing the marking pattern. A topmost surface of the semiconductor chip may be coplanar with a top surface of the molding pattern.

According to some example embodiments of the inventive concepts, a method of fabricating a semiconductor package may include patterning a top surface of a semiconductor chip to form a marking pattern in an intaglio shape, mounting the semiconductor chip on a substrate, forming a vertical connection terminal on the substrate, forming a mold layer on the substrate to cover the semiconductor chip and the vertical connection terminal, a portion of the mold layer filling an inner space of the marking pattern, performing a thinning process on the mold layer to expose the top surface of the semiconductor chip and a top surface of the vertical connection terminal and to leave a portion of the mold layer, which is used as a molding pattern, in the marking pattern, and forming a redistribution layer having an opening on the mold layer, the opening penetrating the redistribution layer and exposing the marking pattern and the molding pattern.

DETAILED DESCRIPTION

Example embodiments of the inventive concepts will now be described more fully with reference to the accompanying drawings, in which some example embodiments are shown.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
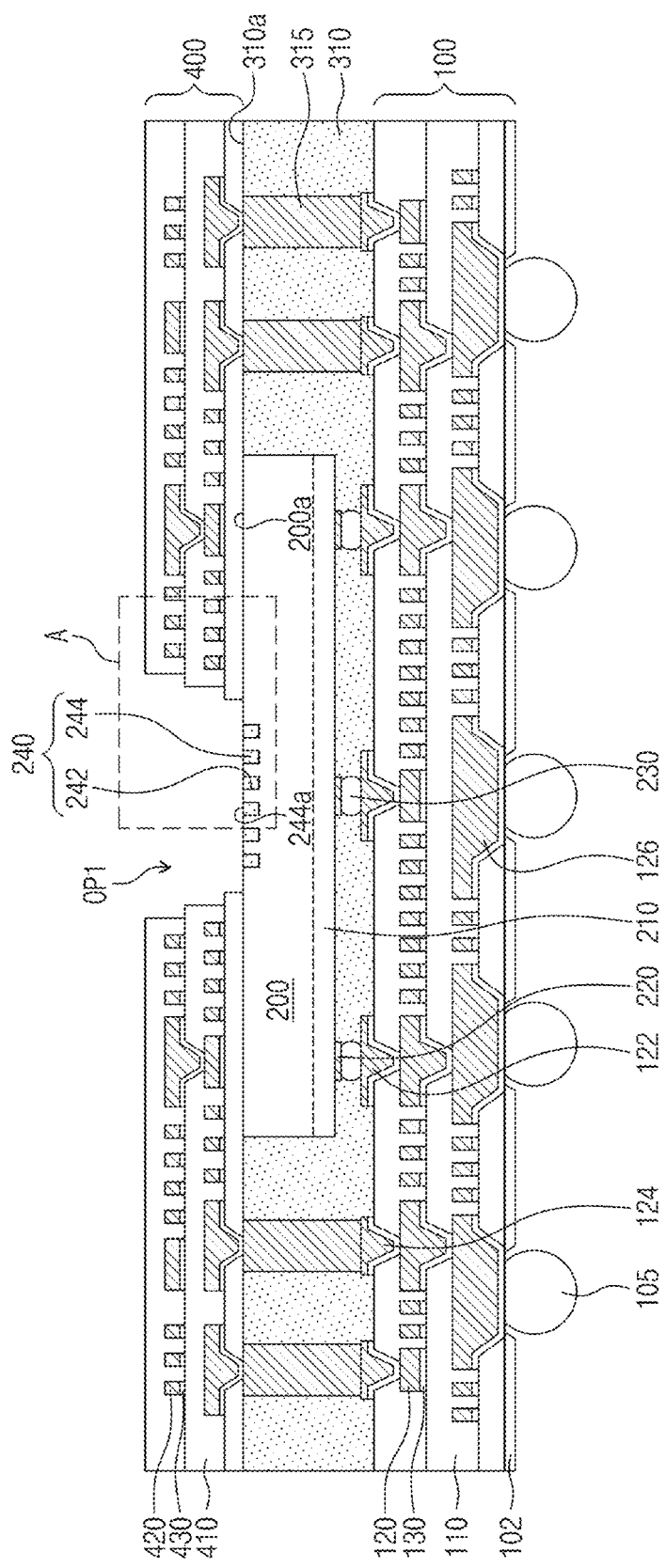
FIG. 1 is a sectional view illustrating a semiconductor package according to an example embodiment of the inventive concepts.
Figure 2:
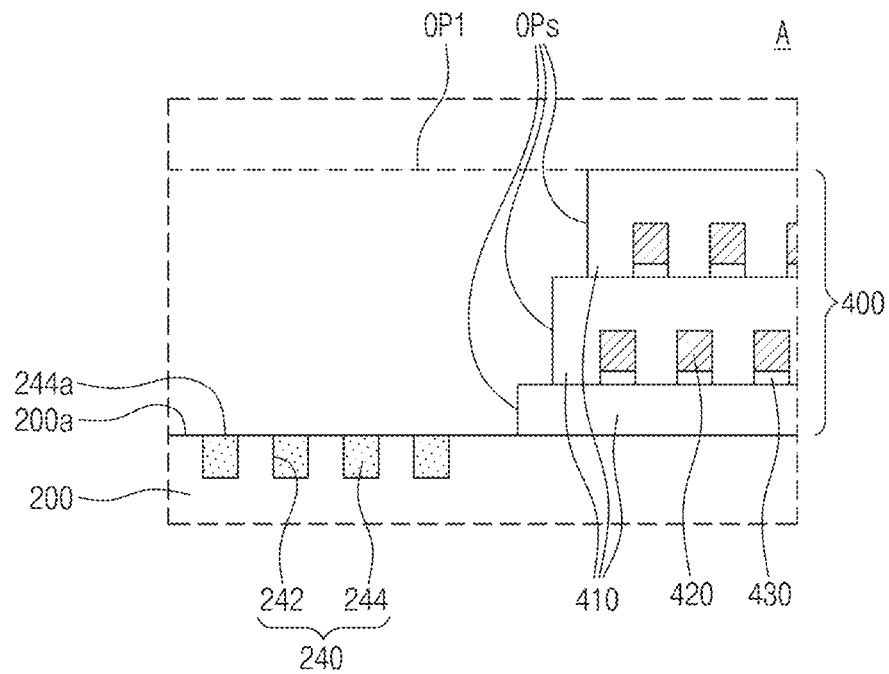
FIGS. 2 and 3 are enlarged sectional views illustrating a portion 'A' of FIG. 1.
Figure 3:
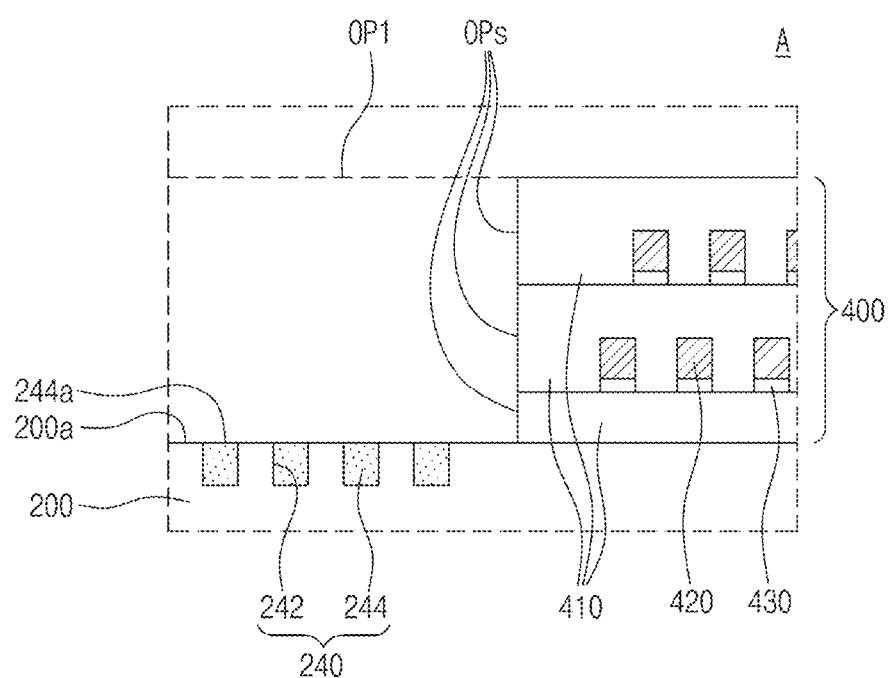

FIG. 1 is a sectional view illustrating a semiconductor package according to an example embodiment of the inventive concepts. FIGS. 2 and 3 are enlarged sectional views illustrating a portion 'A' of FIG. 1.

Referring to FIGS. 1 and 2, a lower package substrate 100 may be provided. The lower package substrate 100 may be a redistribution substrate. The lower package substrate 100 may include at least two first substrate interconnection layers. Each of the first substrate interconnection layers may include a first substrate insulating pattern 110 and a first substrate interconnection pattern 120 in the first substrate insulating pattern 110. The first substrate interconnection pattern 120 of one of the first substrate interconnection layers may be electrically connected to the first substrate interconnection pattern 120 of another first substrate interconnection layer adjacent thereto. In the following description, the structure of the lower package substrate 100 will be described in more detail with reference to one of the first substrate interconnection layers.

The first substrate insulating pattern 110 may be formed of or include at least one of insulating polymers or photo imageable dielectric (PID) materials. For example, the photo imageable dielectric materials may include at least one of photoimageable polyimide (PI), polybenzoxazole (PBO), phenol-based polymers, or benzocyclobutene-based polymers. In some example embodiments, the first substrate insulating pattern 110 may include an insulating material. For example, the first substrate insulating pattern 110 may be formed of or include at least one of silicon oxide (SiO), silicon nitride (SiN), silicon oxynitride (SiON), or insulating polymers.

The first substrate interconnection pattern 120 may be provided on the first substrate insulating pattern 110. The first substrate interconnection pattern 120 may be horizontally extended on the first substrate insulating pattern 110. The first substrate interconnection pattern 120 may be an element that is provided for redistribution in the first substrate interconnection layer. The first substrate interconnection pattern 120 may include a conductive material. For example, the first substrate interconnection pattern 120 may be formed of or include copper (Cu).

The first substrate interconnection pattern 120 may have a damascene structure. For example, the first substrate interconnection pattern 120 may have a head portion and a tail portion which are connected to form a single object. The head and tail portions may have no interface therebetween. Here, a width of the head portion, which is connected to the tail portion, may be larger than a width of the tail portion.

Thus, the head and tail portions of the first substrate interconnection pattern 120 may have a 'T'-shaped section.

The head portion of the first substrate interconnection pattern 120 may be a wire or pad portion which is used to horizontally expand an interconnection line in the lower package substrate 100. The head portion may be provided on a top surface of the first substrate insulating pattern 110. For example, the head portion may protrude above the top surface of the first substrate insulating pattern 110. The head portion of the first substrate interconnection pattern 120 of the uppermost one of the first substrate interconnection layers may correspond to first substrate pads 122, which are used to mount a lower semiconductor chip 200 on the lower package substrate 100, and a second substrate pad 124, to which a penetration electrode 315 is coupled.

The tail portion of the first substrate interconnection pattern 120 may be a via portion vertically connecting interconnection lines in the lower package substrate 100 to each other. The tail portion may be connected to a bottom surface of the head portion. The tail portion may be coupled to another first substrate interconnection layer disposed therebelow. For example, the tail portion of the first substrate interconnection pattern 120 may be extended from the bottom surface of the head portion to penetrate the first substrate insulating pattern 110 and may be coupled to the head portion of the first substrate interconnection pattern 120 of another first substrate interconnection layer disposed therebelow. The tail portion of the first substrate interconnection pattern 120 of the lowermost one of the first substrate interconnection layers may be exposed to the outside of the first substrate insulating pattern 110 near a bottom surface of the first substrate insulating pattern 110. The tail portion of the first substrate interconnection pattern 120, which is exposed near the bottom surface of the lowermost one of the first substrate insulating patterns 110, may correspond to under-bump pads 126, which are used to connect outer terminals 105 to the lower package substrate 100.

A first seed/barrier layer 130 may be interposed between the first substrate insulating pattern 110 and the first substrate interconnection pattern 120. The first seed/barrier layer 130 may cover side and bottom surfaces of the first substrate interconnection pattern 120. The first seed/barrier layer 130 may be formed of or include at least one of metallic materials (e.g., gold (Au), titanium (Ti), or tantalum (Ta)). In some example embodiments, the first seed/barrier layer 130 may be formed of or include at least one of metal nitride materials (e.g., titanium nitride (TiN) or tantalum nitride (TaN)).

A protection layer 102 may be provided below the lowermost one of the first substrate interconnection layers. The protection layer 102 may cover the bottom surface of the first substrate insulating pattern 110 at the lowermost level. The protection layer 102 may be configured to protect a bottom surface of the lower package substrate 100. Here, the under-bump pads 126 may be exposed to the outside of the protection layer 102 through a recess formed in the protection layer 102. The recess may be an empty region, in which the outer terminal 105 is provided. The protection layer 102 may include an insulating material. For example, the protection layer 102 may be formed of or include at least one of silicon oxide (SiO), silicon nitride (SiN), silicon oxynitride (SiON), or insulating polymers.

The outer terminals 105 may be disposed below the lower package substrate 100. For example, the outer terminals 105 may be disposed on the under-bump pads 126, which are disposed near the bottom surface of the lower package substrate 100. For example, the outer terminals 105 may be placed in the recesses, which are formed in the protection layer 102, and may be coupled to bottom surfaces of the under-bump pads 126. The outer terminals 105 may include solder balls or solder bumps, and according to the kind or arrangement of the outer terminals 105, the semiconductor package may have a ball-grid array (BGA) structure, a fine ball-grid array (FBGA) structure, or a land grid array (LGA) structure.

The lower semiconductor chip 200 may be disposed on the lower package substrate 100. The lower semiconductor chip 200 may be disposed on a top surface of the lower package substrate 100. The lower semiconductor chip 200 may include a memory chip or a logic chip. In an example embodiment, the lower semiconductor chip 200 may include a passive element. The lower semiconductor chip 200 may be disposed on the lower package substrate 100 in a face down manner. For example, the lower semiconductor chip 200 may have a front surface, which faces the lower package substrate 100, and a rear surface, which is opposite to the front surface. Hereinafter, in the present specification, the front surface may be a surface of a semiconductor chip, which is called an active surface, and on which integrated devices or pads are formed, and the rear surface may be another surface of a semiconductor chip that is opposite to the front surface. According to positions of the lower package substrate 100 and the lower semiconductor chip 200, a bottom surface of the lower semiconductor chip 200 may correspond to the front surface of the lower semiconductor chip 200, and a top surface 200a of the lower semiconductor chip 200 may correspond to the rear surface of the lower semiconductor chip 200. In the present specification, the top surface 200a of the lower semiconductor chip 200 may mean a top surface of a base layer of the lower semiconductor chip 200, on which a first circuit layer 210 to be described below will be formed, and may correspond to the largest surface of upward surfaces of the lower semiconductor chip 200. The lower semiconductor chip 200 may be formed of or include a semiconductor material (e.g., silicon (Si)). The lower semiconductor chip 200 may include the first circuit layer 210, which is provided adjacent to the bottom surface of the lower semiconductor chip 200 facing the lower package substrate 100.

The first circuit layer 210 may be provided as a lower portion of the lower semiconductor chip 200. The first circuit layer 210 may be electrically connected to an integrated device or integrated circuits formed in the lower semiconductor chip 200. The lower semiconductor chip 200 may have first chip pads 220 provided on the bottom surface of the lower semiconductor chip 200. The first chip pads 220 may be electrically connected to the integrated device or the integrated circuits in the lower semiconductor chip 200 through the first circuit layer 210.

The lower semiconductor chip 200 may be mounted on the lower package substrate 100. The lower semiconductor chip 200 may be mounted on the lower package substrate 100 in a flip chip manner. For example, the lower semiconductor chip 200 may be provided such that the first circuit layer 210 faces the lower package substrate 100. Here, first chip terminals 230 may be provided below the first chip pads 220 of the lower semiconductor chip 200. The lower semiconductor chip 200 may be mounted on the lower package substrate 100 through the first chip terminals 230. The first chip terminals 230 may connect the first chip pads 220 of the lower semiconductor chip 200 to the first substrate pads 122 of the lower package substrate 100.

The lower semiconductor chip 200 may have a cognition mark 240. As shown in FIGS. 1 and 2, the cognition mark 240 may include a marking pattern 242 and a molding pattern 244.

The marking pattern 242 may be provided in the top surface 200a of the lower semiconductor chip 200. For example, the marking pattern 242 may be formed by carving the top surface 200a of the lower semiconductor chip 200. The marking pattern 242 (e.g., the bottom surface of the marking pattern 242) may be located at a level different from the top surface (e.g., the topmost surface) 200a of the lower semiconductor chip 200. As an example, in the example embodiment of FIGS. 1 and 2, the marking pattern 242 may be an intaglio pattern which is formed in the top surface 200a of the lower semiconductor chip 200. For example, the marking pattern 242 may have a shape, which is recessed from the top surface 200a of the lower semiconductor chip 200 toward the bottom surface of the lower semiconductor chip 200.

The molding pattern 244 may be provided on the lower semiconductor chip 200. The molding pattern 244 may expose the marking pattern 242. Here, the marking pattern 242 may mean the entirety of an intaglio region, which is recessed from the top surface 200a of the lower semiconductor chip 200, and the expression "the marking pattern 242 is exposed" may mean that a planar shape of the marking pattern 242 can be visually viewed from a position over the lower semiconductor chip 200. For example, in the example embodiment of FIGS. 1 and 2, the molding pattern 244 may fill an inner space of the marking pattern 242. For example, the molding pattern 244 may fill the intaglio region of the marking pattern 242. The molding pattern 244 may not be extended to a region on the top surface 200a of the lower semiconductor chip 200. For example, the molding pattern 244 may fully fill an inner space of the marking pattern 242 and may not be extended to a level higher than the top surface 200a of the lower semiconductor chip 200. In other words, a planar shape of the cognition mark 240 may be defined by a boundary between the molding pattern 244, which fills an inner space of the marking pattern 242, and the top surface 200a of the lower semiconductor chip 200, which is located outside the marking pattern 242. A top surface 244a of the molding pattern 244 may be provided at the same level as the top surface 200a of the lower semiconductor chip 200, and the top surface 244a of the molding pattern 244 and the top surface 200a of the lower semiconductor chip 200 may be coplanar with each other. The top surface 244a of the molding pattern 244 and the top surface 200a of the lower semiconductor chip 200 may be provided on a substantially flat plane. A first material constituting the molding pattern 244 may have the same material as a second material constituting a lower mold layer 310, which will be described below. This is because the molding pattern 244 is formed during a fabricating process of a semiconductor package (for example, by the same process as that for the lower mold layer 310), and this will be described in more detail with reference to the fabricating process of the semiconductor package to be described below. The first material of the molding pattern 244 may include an insulating material (e.g., an epoxy molding compound (EMC)). The first material of the molding pattern 244 may have a different color from the top surface 200a of the lower semiconductor chip 200. As an example, the top surface 200a of the lower semiconductor chip 200, which is formed of silicon (Si), may have a metallic gloss of gray color, whereas the top surface 244a of the molding pattern 244, which is formed of the epoxy molding compound (EMC), may have a matte black color.

In the case where the cognition mark 240 is formed using only the marking pattern 242, the cognition mark 240 may be recognized using only a difference in surface shape or bending structure between the marking pattern 242 and the top surface 200a of the lower semiconductor chip 200, and in this case, the visibility of the cognition mark 240 may be relatively low.

According to an example embodiment of the inventive concepts, the cognition mark 240 may be formed by filling the marking pattern 242 with the molding pattern 244, in addition to the marking pattern 242 that is an intaglio pattern formed in the top surface 200a of the lower semiconductor chip 200. Because the molding pattern 244 is formed using a material having a different color from the top surface 200a of the lower semiconductor chip 200, there may be a difference in color between the molding pattern 244 and the lower semiconductor chip 200, and this color difference may be used to recognize the cognition mark 240. Thus, the visibility of the cognition mark 240 may be relatively high.

In addition, the top surface 200a of the lower semiconductor chip 200 and the top surface 244a of the molding pattern 244 may be coplanar with each other. That is, an uneven profile, which is formed on the top surface 200a of the lower semiconductor chip 200 by the marking pattern 242, may be compensated by the molding pattern 244, and thus the lower semiconductor chip 200 and the cognition mark 240 may have substantially flat top surfaces. Accordingly, in a subsequent step, it may be possible to easily form a redistribution layer 400 on the lower semiconductor chip 200.

The lower mold layer 310 may be provided on the lower package substrate 100. The lower mold layer 310 may cover the top surface of the lower package substrate 100. The lower mold layer 310 may enclose the lower semiconductor chip 200, when viewed in a plan view. The lower mold layer 310 may cover a side surface of the lower semiconductor chip 200 and expose the topmost surface of the lower semiconductor chip 200. In the example embodiment of FIGS. 1 and 2, the topmost surface of the lower semiconductor chip 200 may correspond to the top surface 200a of the lower semiconductor chip 200 (e.g., the rear surface of the lower semiconductor chip 200). In other words, the lower mold layer 310 may cover the side surface of the lower semiconductor chip 200 and expose the top surface 200a of the lower semiconductor chip 200. A top surface 310a of the lower mold layer 310 may be coplanar with the top surface 200a of the lower semiconductor chip 200. Here, the top surface 310a of the lower mold layer 310 and the top surface 200a of the lower semiconductor chip 200 may be substantially flat. In other words, the top surface 310a of the lower mold layer 310 and the top surface 200a of the lower semiconductor chip 200 may be located on the same plane. The top surface 310a of the lower mold layer 310, the top surface 200a of the lower semiconductor chip 200, and the top surface 244a of the molding pattern 244 may be coplanar with each other. The lower mold layer 310 may fill a space between the lower package substrate 100 and the lower semiconductor chip 200. Between the lower package substrate 100 and the lower semiconductor chip 200, the lower mold layer 310 may enclose the first chip terminals 230. The lower mold layer 310 may be formed of or include the same material as the molding pattern 244. The lower mold layer 310 may be formed of or include an insulating material (e.g., an epoxy molding compound (EMC)).

At least one penetration electrode 315 may be provided on the lower package substrate 100. The penetration electrode 315 may correspond to a vertical connection terminal, which is used to connect the lower package substrate 100 to the redistribution layer 400. The penetration electrode 315 may be horizontally spaced apart from the lower semiconductor chip 200. The penetration electrode 315 may vertically penetrate the lower mold layer 310. An end of the penetration electrode 315 may be extended toward the lower package substrate 100 and may be coupled to the second substrate pad 124 of the lower package substrate 100. An opposite end of the penetration electrode 315 may be exposed to the outside of the lower mold layer 310 near the top surface 310a of the lower mold layer 310. A top surface of the penetration electrode 315 may be coplanar with the top surface 310a of the lower mold layer 310. Here, the top surface 310a of the lower mold layer 310 and the top surface of the penetration electrode 315 may be substantially flat. In other words, the top surface 310a of the lower mold layer 310 and the top surface of the penetration electrode 315 may be located on the same plane. In other words, the top surface 310a of the lower mold layer 310, the top surface 200a of the lower semiconductor chip 200, and the top surface of the penetration electrode 315 may be coplanar with each other. The penetration electrode 315 may be shaped like a circular or polygonal pillar and may vertically penetrate the lower mold layer 310. A width of the penetration electrode 315 may be constant, regardless of a distance from the lower package substrate 100. In some example embodiments, the width of the penetration electrode 315 may decrease in a direction toward the package substrate 100. In an example embodiment, a plurality of the penetration electrodes 315 may be provided. In this case, the semiconductor package may include a plurality of second substrate pads 124, each of which is coupled to a corresponding one of the penetration electrodes 315. The penetration electrode 315 may be formed of or include at least one of metallic materials. For example, the penetration electrode 315 may be formed of or include copper (Cu).

In the present specification, the term 'penetration electrode' may mean an electrode vertically penetrating an element, and the inventive concepts are limited to a specific planar shape of the penetration electrode. For example, the planar shape of the penetration electrode may be one of circular, polygonal, partition, or wall shapes.

The redistribution layer 400 may be provided on the lower mold layer 310. The redistribution layer 400 may be in direct contact with the top surface 310a of the lower mold layer 310, the top surface of the penetration electrode 315, and the top surface 200a of the lower semiconductor chip 200.

The redistribution layer 400 may include one or more second substrate interconnection layers which are stacked on top of each other. Each of the second substrate interconnection layers may include a second substrate insulating pattern 410 and a second substrate interconnection pattern 420 in the second substrate insulating pattern 410. In the case where a plurality of the second substrate interconnection layers are provided, the second substrate interconnection pattern 420 of each second substrate interconnection layer may be electrically connected to the second substrate interconnection pattern 420 of another second substrate interconnection layer adjacent thereto.

The second substrate insulating pattern 410 may be formed of or include at least one of insulating polymers or photo imageable dielectric (PID) materials. For example, the photo imageable dielectric materials may include at least one of photoimageable polyimide (PI), polybenzoxazole (PBO), phenol-based polymers, or benzocyclobutene-based polymers. In some example embodiments, the second substrate insulating pattern 410 may include an insulating material. For example, the second substrate insulating pattern 410 may be formed of or include at least one of silicon oxide (SiO), silicon nitride (SiN), silicon oxynitride (SiON), or insulating polymers.

The second substrate interconnection pattern 420 may be provided on the second substrate insulating pattern 410. The second substrate interconnection pattern 420 may be horizontally extended on the second substrate insulating pattern 410. The second substrate interconnection pattern 420 may be an element that is provided for redistribution in the second substrate interconnection layer. The second substrate interconnection pattern 420 may include a conductive material. For example, the second substrate interconnection pattern 420 may be formed of or include copper (Cu). The second substrate interconnection pattern 420 may have a damascene structure. For example, the second substrate interconnection pattern 420 may include a head portion and a tail portion which are connected to form a single object (e.g., an integral structure). The head and tail portions of the second substrate interconnection pattern 420 may have a 'T'-shaped section.

The head portion of the second substrate interconnection pattern 420 may be a wire or pad portion which is used to horizontally expand an interconnection line in the redistribution layer 400. The head portion may be provided on a top surface of the second substrate insulating pattern 410. For example, the head portion may protrude above the top surface of the second substrate insulating pattern 410.

The tail portion of the second substrate insulating pattern 410 may be a via portion vertically connecting interconnection lines in the redistribution layer 400. The tail portion may be coupled to another second substrate interconnection layer disposed therebelow. For example, the tail portion of the second substrate insulating pattern 410 may be extended from the bottom surface of the head portion to penetrate the second substrate insulating pattern 410 and may be coupled to the head portion of the second substrate interconnection pattern 420 of another second substrate interconnection layer disposed therebelow. The tail portion of the second substrate interconnection pattern 420 of the lowermost one of the second substrate interconnection layers may penetrate the second substrate insulating pattern 410 and may be coupled to the penetration electrode 315.

A second seed/barrier layer 430 may be interposed between the second substrate insulating pattern 410 and the second substrate interconnection pattern 420. The second seed/barrier layer 430 may cover side and bottom surfaces of the second substrate interconnection pattern 420. The second seed/barrier layer 430 may be formed of or include at least one of metallic materials (e.g., gold (Au), titanium (Ti), or tantalum (Ta)). In an example embodiment, the second seed/barrier layer 430 may be formed of or include at least one of metal nitride materials (e.g., titanium nitride (TiN) or tantalum nitride (TaN)).

The redistribution layer 400 may have a first opening OP1. The first opening OP1 may vertically penetrate the redistribution layer 400. The first opening OP1 may be placed on the lower semiconductor chip 200. The first opening OP1 may expose the cognition mark 240, which is provided in the top surface 200a of the lower semiconductor chip 200.

According to an example embodiment of the inventive concepts, the first opening OP1 may be formed in the redistribution layer 400 to expose the cognition mark 240. Accordingly, when viewed from a position over the semiconductor package, the cognition mark 240 may not be veiled by the redistribution layer 400, and thus visibility of the cognition mark 240 may be further increased.

An inner side surface of the first opening OP1 may have a stepwise shape. For example, as shown in FIG. 1, the first opening OP1 may be defined by the redistribution layer 400 (e.g., the second substrate insulating patterns 410 of the redistribution layer 400). Here, each of the second substrate insulating patterns 410 of the redistribution layer 400 may constitute a single step. As an example, the second substrate insulating patterns 410 may have sub-openings OPs, each of which vertically penetrates a corresponding one of the second substrate insulating patterns 410, and as a distance from the top surface of the lower semiconductor chip 200 increases, widths of the sub-opening OPs of the second substrate insulating patterns 410 may increase.

In another example embodiment, as shown in FIG. 3, a width of the first opening OP1 may be constant, regardless of a distance from the top surface 200a of the lower semiconductor chip 200. For example, the sub-openings OPs of the second substrate insulating patterns 410 may have the same width.

Figure 4:
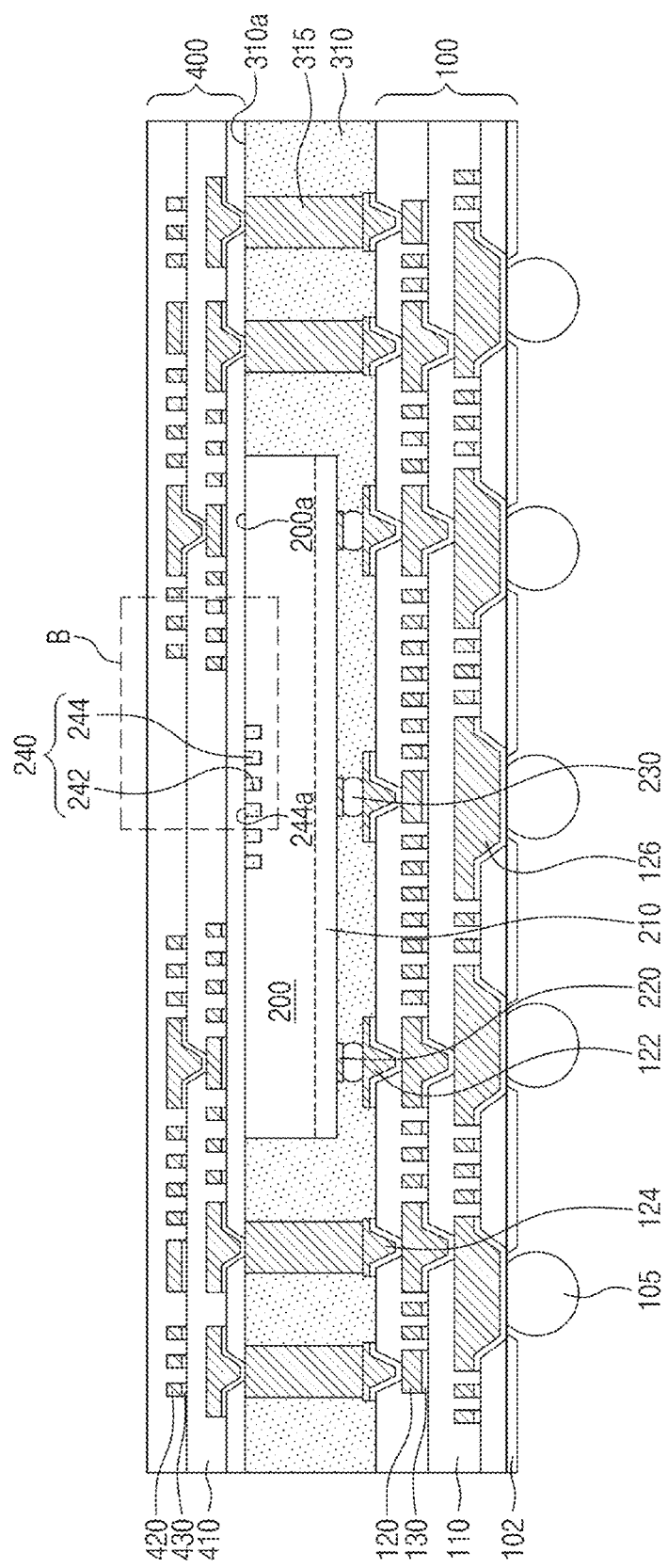
FIG. 4 is a sectional view illustrating a semiconductor package according to an example embodiment of the inventive concepts.
Figure 5:
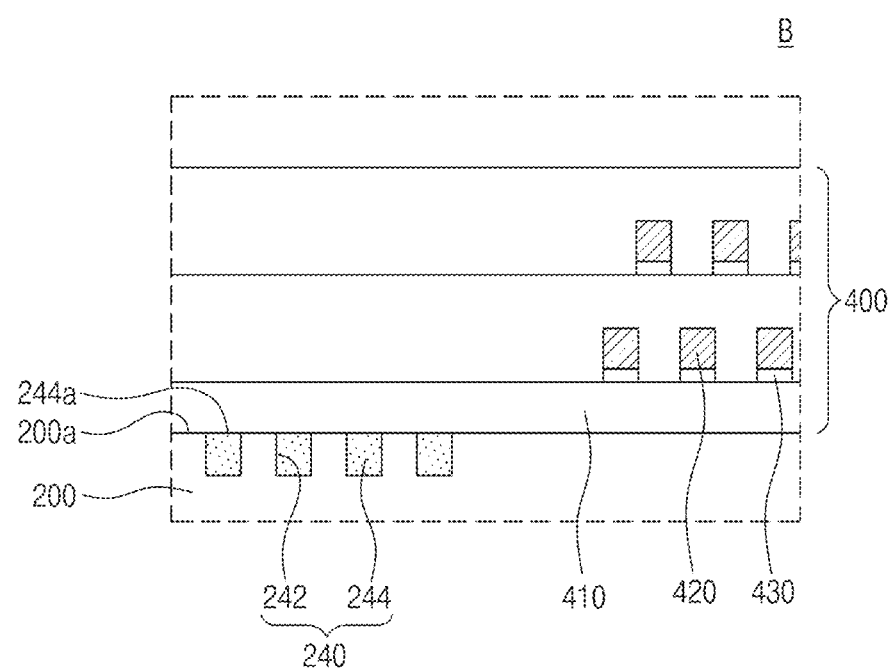
FIG. 5 is an enlarged sectional view illustrating a portion 'B' of FIG. 4.

FIG. 4 is a sectional view illustrating a semiconductor package according to an example embodiment of the inventive concepts. FIG. 5 is an enlarged sectional view illustrating a portion 'B' of FIG. 4. For concise description, an element previously described with reference to FIGS. 1 to 3 may be identified by the same reference number without repeating an overlapping description thereof. That is, technical features, which are different from those in the example embodiments of FIGS. 1 to 3, will be mainly described below.

Referring to FIGS. 4 and 5, the redistribution layer 400 may be provided on the lower mold layer 310. The redistribution layer 400 may be in direct contact with the top surface 310a of the lower mold layer 310, the top surface of the penetration electrode 315, and the top surface 200a of the lower semiconductor chip 200. The redistribution layer 400 may fully cover the top surface 200a of the lower semiconductor chip 200.

The redistribution layer 400 may include one or more second substrate interconnection layers which are stacked on top of each other. Each of the second substrate interconnection layers may include the second substrate insulating pattern 410 and the second substrate interconnection pattern 420 in the second substrate insulating pattern 410. In the case where a plurality of the second substrate interconnection layers are provided, the second substrate interconnection pattern 420 of each second substrate interconnection layer may be electrically connected to the second substrate interconnection pattern 420 of another second substrate interconnection layer adjacent thereto.

The second substrate insulating pattern 410 may be formed of or include a transparent insulating material. For example, the second substrate insulating pattern 410 may be formed of or include at least one of transparent photo imageable dielectric (PID) materials. For example, the photo imageable dielectric material may include photoimageable poly imide (PI) or polybenzoxazole (PBO).

The second substrate interconnection pattern 420 may be provided on the second substrate insulating pattern 410. The second substrate interconnection pattern 420 may be horizontally extended on the second substrate insulating pattern 410. The second substrate interconnection pattern 420 may include a conductive material. The second substrate interconnection pattern 420 may have a damascene structure. For example, the second substrate interconnection pattern 420 may include a head portion and a tail portion which are connected to form a single object. The head and tail portions of the second substrate interconnection pattern 420 may have a 'T'-shaped section.

The second substrate interconnection pattern 420 may not be vertically overlapped with the cognition mark 240. For example, the second substrate interconnection pattern 420 may be located outside the cognition mark 240, when viewed in a plan view. For example, the cognition mark 240 may be located on a center portion or a central portion of the lower package substrate 100, whereas the second substrate interconnection pattern 420 may be located on a peripheral portion of the lower package substrate 100.

According to an example embodiment of the inventive concepts, the second substrate interconnection pattern 420, which is formed of a metallic material, may not veil the cognition mark 240. Further, the second substrate insulating pattern 410 may be formed of or include a transparent material. Thus, it may be possible to optically inspect the cognition mark 240 placed below the redistribution layer 400. As a result, the cognition mark 240 may be effectively inspected using light passing through the redistribution layer 400, and it may be possible to improve visibility in such an inspection process.

Figure 6:
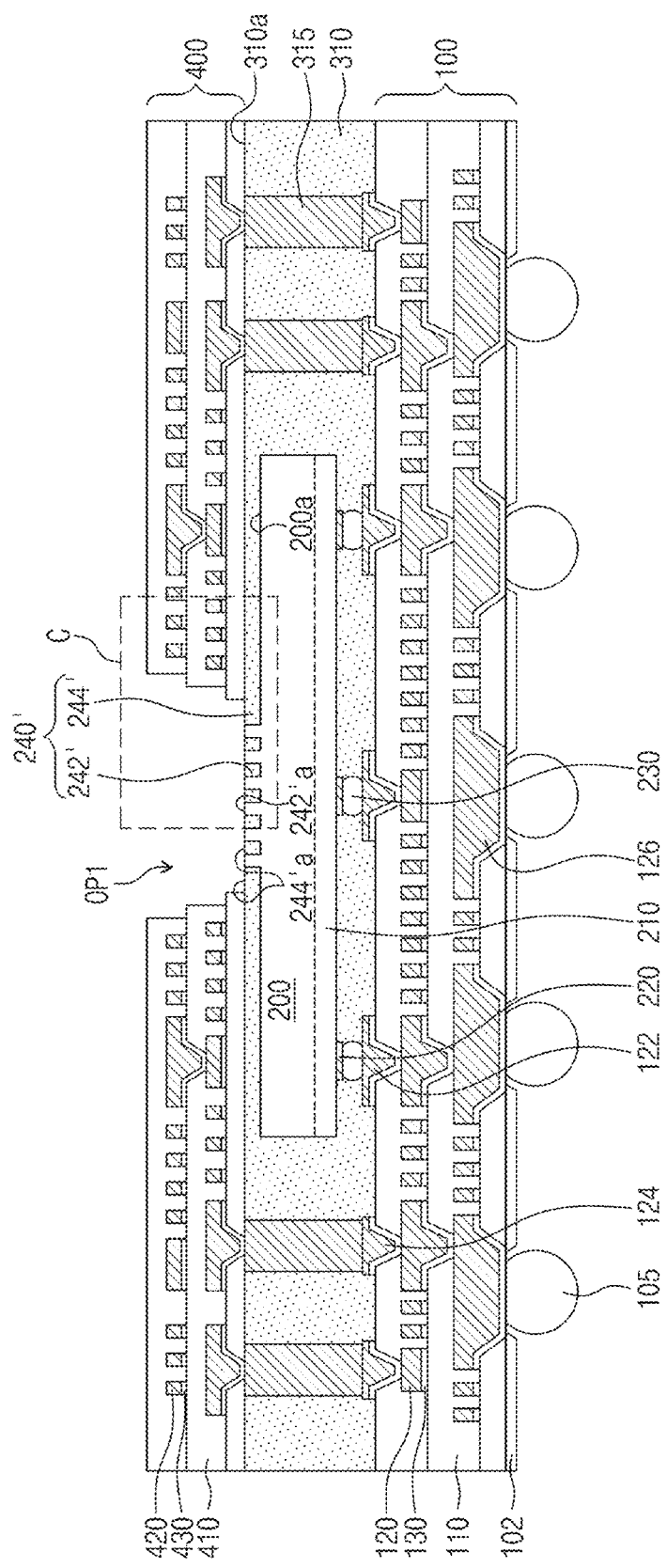
FIG. 6 is a sectional view illustrating a semiconductor package according to an example embodiment of the inventive concepts.
Figure 7:
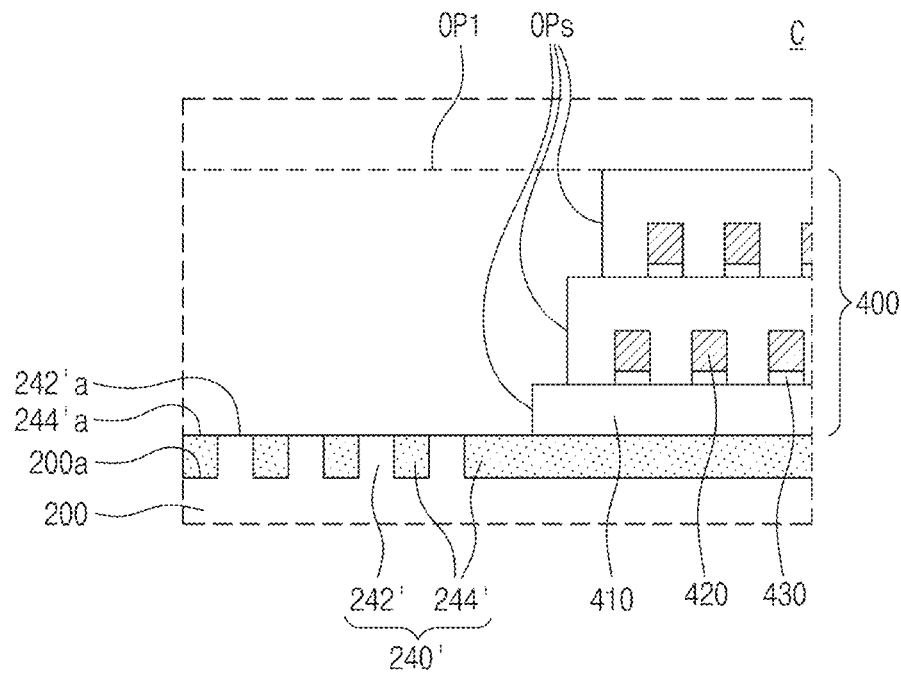
FIGS. 7 and 8 are enlarged sectional views illustrating a portion 'C' of FIG. 6.
Figure 8:
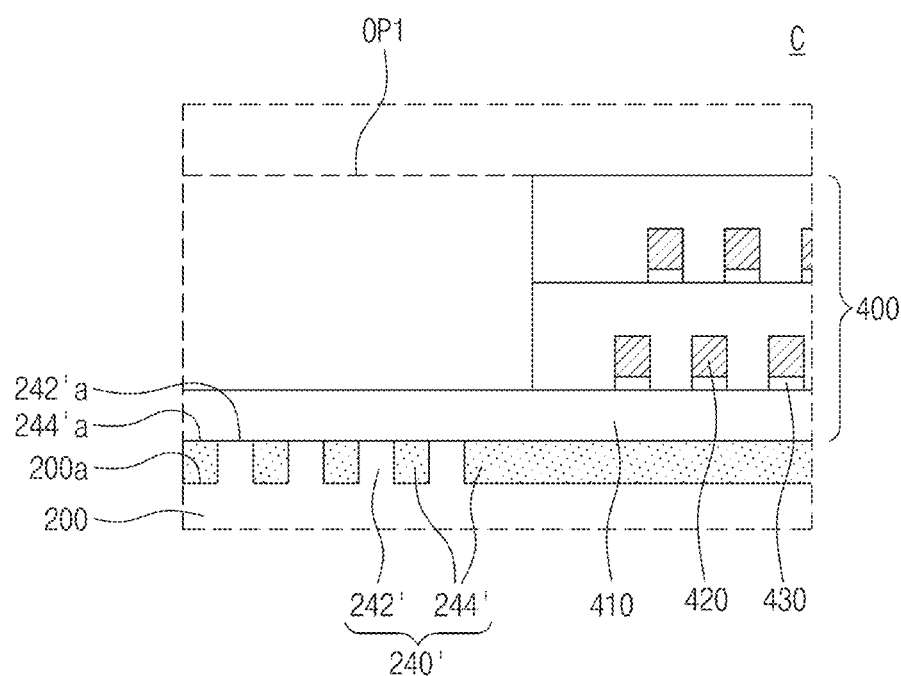

FIG. 6 is a sectional view illustrating a semiconductor package according to an example embodiment of the inventive concepts. FIGS. 7 and 8 are enlarged sectional views illustrating a portion 'C' of FIG. 6.

Referring to FIGS. 6 and 7, the lower semiconductor chip 200 may have a cognition mark 240'. The cognition mark 240' may include a marking pattern 242' and a molding pattern 244'.

The marking pattern 242' may be formed in the top surface 200a of the lower semiconductor chip 200. For example, the marking pattern 242' may be formed by carving the top surface 200a of the lower semiconductor chip 200. The top surface of the marking pattern 242' may be located at a level different from the top surface 200a (more specifically, a lowermost portion of the top surface) of the lower semiconductor chip 200. The topmost surface of the lower semiconductor chip 200 is coplanar with a top surface of the molding pattern 244'. As an example, in the example embodiment of FIGS. 6 and 7, the marking pattern 242' may be an embossing pattern, which is formed on the top surface 200a of the lower semiconductor chip 200. In other words, the marking pattern 242' may have a shape protruding upwardly from the top surface 200a of the lower semiconductor chip 200. In this case, the topmost surface of the lower semiconductor chip 200 may correspond to a top surface 242'a of the marking pattern 242'.

The molding pattern 244' may be provided on the lower semiconductor chip 200. The molding pattern 244' may expose the marking pattern 242'. Here, the marking pattern 242' may mean the entirety of an embossing region, which protrudes from the top surface 200a of the lower semiconductor chip 200, and the expression "the marking pattern 242' is exposed" may mean that a planar shape of the marking pattern 242' can be visually viewed from a position over the lower semiconductor chip 200. For example, in the example embodiment of FIGS. 6 and 7, the molding pattern 244' may be provided on the top surface 200a of the lower semiconductor chip 200 to enclose the marking pattern 242'. In other words, the molding pattern 244' may enclose an embossing region of the marking pattern 242'. The molding pattern 244' may not be extended to a region on the top surface 242'a of the marking pattern 242'. For example, the molding pattern 244' may not be extended to a level higher the top surface 242'a of the marking pattern 242'. In other words, a planar shape of the cognition mark 240' may be defined by a boundary between the marking pattern 242' and the molding pattern 244' enclosing the marking pattern 242'. A top surface 244'a of the molding pattern 244' may be provided at the same level as the top surface 242'a of the marking pattern 242', and the top surface 244'a of the molding pattern 244' may be coplanar with the top surface 242'a of the marking pattern 242'. The top surface 244'a of the molding pattern 244' and the top surface 242'a of the marking pattern 242' may be provided on a substantially flat plane. The topmost surface of the lower semiconductor chip 200 may corresponds to the top surface of the embossing region. A first material constituting the molding pattern 244' may be formed of or include the same material as a second material constituting the lower mold layer 310. The first material of the molding pattern 244' may be formed of or include an insulating material (e.g., an epoxy molding compound (EMC)). The first material of the molding pattern 244' may have a different color from the top surface 242'a of the marking pattern 242'.

The lower mold layer 310 may be provided on the lower package substrate 100. The lower mold layer 310 may cover the top surface of the lower package substrate 100. The lower mold layer 310 may enclose the lower semiconductor chip 200, when viewed in a plan view. The lower mold layer 310 may cover the side surface of the lower semiconductor chip 200 and expose the topmost surface of the lower semiconductor chip 200. In the example embodiment of FIGS. 6 and 7, the topmost surface of the lower semiconductor chip 200 may be the top surface 242'a of the marking pattern 242'. The lower mold layer 310 may be connected to the molding pattern 244' of the cognition mark 240 to form a single object. For example, the lower mold layer 310 and the molding pattern 244' may be formed of the same material, and in this case, there may be no interface between the lower mold layer 310 and the molding pattern 244'. The top surface 310a of the lower mold layer 310, the top surface 244'a of the molding pattern 244', and the top surface 242'a of the marking pattern 242' may be coplanar with each other. Here, the top surface 310a of the lower mold layer 310, the top surface 244'a of the molding pattern 244', and the top surface 242'a of the marking pattern 242' may be substantially flat. In other words, the top surface 310a of the lower mold layer 310, the top surface 244'a of the molding pattern 244', and the top surface 242'a of the marking pattern 242' may be located on the same plane.

The redistribution layer 400 may be provided on the lower mold layer 310. The redistribution layer 400 may be in direct contact with the top surface 310a of the lower mold layer 310, the top surface of the penetration electrode 315, and the top surface 200a of the lower semiconductor chip 200.

The redistribution layer 400 may include one or more second substrate interconnection layers which are stacked on top of each other. Each of the second substrate interconnection layers may include the second substrate insulating pattern 410 and the second substrate interconnection pattern 420 in the second substrate insulating pattern 410. In the case where a plurality of the second substrate interconnection layers are provided, the second substrate interconnection pattern 420 of each second substrate interconnection layer may be electrically connected to the second substrate interconnection pattern 420 of another second substrate interconnection layer adjacent thereto.

The redistribution layer 400 may have the first opening OP1. The first opening OP1 may vertically penetrate the redistribution layer 400. The first opening OP1 may be placed on the lower semiconductor chip 200. The first opening OP1 may expose the cognition mark 240, which is provided in the top surface 200a of the lower semiconductor chip 200.

An inner side surface of the first opening OP1 may have a stepwise shape. For example, each of the second substrate insulating patterns 410 of the redistribution layer 400 may constitute a single step, as shown in FIG. 7. As an example, the second substrate insulating patterns 410 may have sub-openings OPs, each of which vertically penetrates a corresponding one of the second substrate insulating patterns 410, and as a distance from the top surface of the lower semiconductor chip 200 increases, widths of the sub-opening OPs of the second substrate insulating patterns 410 may increase.

In another example embodiment, as shown in FIG. 8, a width of the first opening OP1 may be uniform, regardless of a distance from the top surface 200a of the lower semiconductor chip 200. For example, the sub-openings OPs of the second substrate insulating patterns 410 may have the same width.

Figure 9:
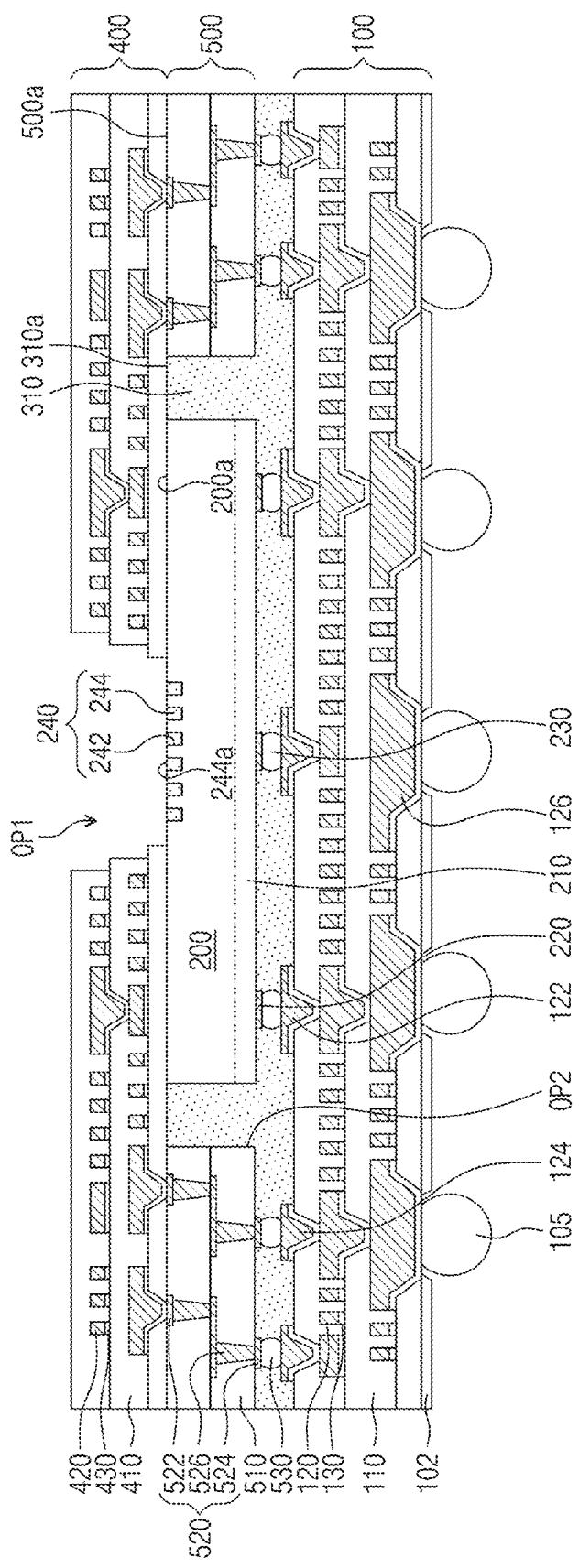
FIGS. 9 and 10 are sectional views, each of which illustrates a semiconductor package according to an example embodiment of the inventive concepts.

FIG. 9 is a sectional view illustrating a semiconductor package according to an example embodiment of the inventive concepts.

Referring to FIG. 9, a connection substrate 500 instead of the penetration electrode 315 (e.g., see FIG. 1) may be provided as a vertical connection terminal connecting the lower package substrate 100 to the redistribution layer 400.

The connection substrate 500 may be provided on the lower package substrate 100. The connection substrate 500 may have a second opening OP2, which penetrates the same. For example, the second opening OP2 may be provided in the form of an open hole vertically connecting top and bottom surfaces of the connection substrate 500. The connection substrate 500 may include a substrate base layer 510 and a conductive portion (alternatively referred to as a connection substrate interconnection pattern) 520, which is provided in the substrate base layer 510 and is used as an interconnection pattern. As an example, the substrate base layer 510 may be formed of or include silicon oxide (SiO). The conductive portion 520 may be disposed in an outer region of the connection substrate 500, which is located outside the opening OP2 when viewed in a plan view. The conductive portion 520 may include connection substrate upper pads 522, connection substrate lower pads 524, and connection substrate vias 526. The connection substrate upper pads 522 may be disposed in an upper portion of the connection substrate 500. The connection substrate lower pads 524 may be disposed on the bottom surface of the connection substrate 500. The connection substrate vias 526 may penetrate the substrate base layer 510 and may be electrically connected to the connection substrate upper pads 522 and the connection substrate lower pads 524.

The connection substrate 500 may be mounted on the lower package substrate 100. For example, connection substrate terminals 530 may be provided on the connection substrate lower pads 524. The connection substrate 500 may be coupled to the second substrate pad 124 of the lower package substrate 100 using the connection substrate terminals 530. Accordingly, the connection substrate 500 may be electrically connected to the lower semiconductor chip 200 and the outer terminals 105.

The lower semiconductor chip 200 may be disposed on the lower package substrate 100. The lower semiconductor chip 200 may be the same as or similar to that described with reference to FIG. 1. For example, the lower semiconductor chip 200 may have the cognition mark 240 provided in the top surface 200a thereof. The cognition mark 240 may have the marking pattern 242 and the molding pattern 244. The lower semiconductor chip 200 may be disposed in the second opening OP2 of the connection substrate 500.

The lower mold layer 310 may be provided on the lower package substrate 100 to fill a space between the connection substrate 500 and the lower semiconductor chip 200. The lower mold layer 310 may be provided in the second opening OP2 to enclose the lower semiconductor chip 200 and may expose the top surface of the lower semiconductor chip 200. The lower mold layer 310 may expose a top surface 500a of the connection substrate 500. The top surface 500a of the connection substrate 500 may be located at the same level as the top surface 310a of the lower mold layer 310 and the top surface 200a of the lower semiconductor chip 200.

The redistribution layer 400 may be provided on the connection substrate 500. The redistribution layer 400 may be in contact with the top surface 500a of the connection substrate 500 and the top surface 200a of the lower semiconductor chip 200. The redistribution layer 400 may be the same as or similar to that described with reference to FIGS. 1 to 5. For example, the redistribution layer 400 may have the first opening OP1 exposing the cognition mark 240 of the lower semiconductor chip 200. The redistribution layer 400 may include one or more second substrate interconnection layers which are stacked on top of each other. Each of the second substrate interconnection layers may include the second substrate insulating pattern 410 and the second substrate interconnection pattern 420. The second substrate interconnection pattern 420 of the lowermost one of the second substrate interconnection layers may penetrate the second substrate insulating pattern 410 and may be coupled to the connection substrate upper pads 522 of the connection substrate 500.

Figure 10:
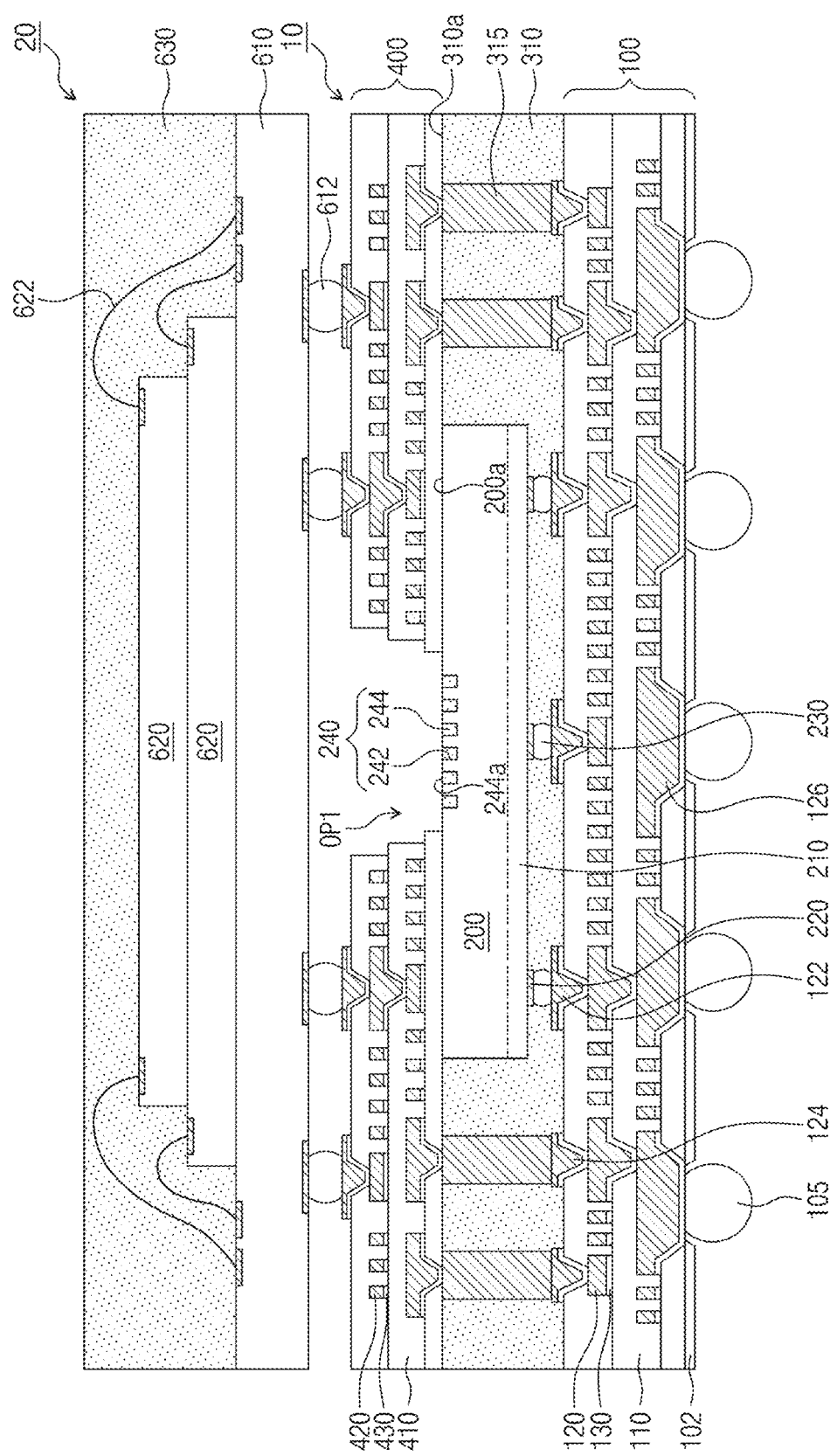

FIG. 10 is a sectional view illustrating a semiconductor package according to an example embodiment of the inventive concepts.

Referring to FIG. 10, a semiconductor package may include a lower package 10 and an upper package 20. In other words, the semiconductor package may have a package-on-package (PoP) structure, in which the upper package 20 is mounted on the lower package 10.

The lower package 10 may have the same or similar structure as the semiconductor package described with reference to FIGS. 1 to 9. For example, the lower package 10 may be configured to have the same or similar features as those of the semiconductor packages of FIGS. 1 to 9.

The upper package 20 may include an upper package substrate 610, an upper semiconductor chip 620, and an upper molding portion 630.

The upper package substrate 610 may be disposed on the redistribution layer 400. Here, the upper package substrate 610 may be vertically spaced apart from the redistribution layer 400. The upper package substrate 610 may be a printed circuit board (PCB) with signal patterns. In an example embodiment, the upper package substrate 610 may have a structure, in which insulating layers and interconnection layers are alternately stacked.

The upper package substrate 610 may be mounted on the redistribution layer 400. For example, substrate terminals 612 may be placed below the upper package substrate 610. The substrate terminals 612 may be coupled to the second substrate interconnection pattern 420 of the redistribution layer 400. The substrate terminals 612 may include solder balls or solder bumps.

At least one upper semiconductor chip 620 may be disposed on the upper package substrate 610. In the case where a plurality of the upper semiconductor chips 620 are provided, the upper semiconductor chip 620 may be vertically stacked or may be spaced apart from each other in a plan view. The upper semiconductor chip 620 may be mounted on a top surface of the upper package substrate 610. For example, the upper semiconductor chip 620 may be mounted on substrate pads of the upper package substrate 610 in a wire bonding manner. For example, the upper semiconductor chip 620 may be electrically connected to the upper package substrate 610 through bonding wires 622. In some example embodiments, the upper semiconductor chip 620 may be mounted on the substrate pads of the upper package substrate 610 in a flip-chip bonding manner. However, the inventive concepts are not limited to this example, and an upper semiconductor chip 820 may be mounted on the upper package substrate 610 by various bonding elements, such as solder balls or solder bumps. For example, the upper semiconductor chip 620 may be a logic chip or a memory chip. The upper semiconductor chip 620 may be electrically connected to the lower package substrate 100 through the upper package substrate 610, the redistribution layer 400, and the penetration electrode 315. FIG. 10 illustrates a structure including two upper semiconductor chips 620, but in an example embodiment, the number of the upper semiconductor chip 620 may be variously changed.

The upper molding portion 630 may be provided on the upper package substrate 610. For example, the upper molding portion 630 may be provided on the top surface of the upper package substrate 610 to enclose the upper semiconductor chip 620. For example, the upper molding portion 630 may be provided on the upper package substrate 610 to encapsulate the upper semiconductor chip 620.

FIGS. 11 to 20 are sectional views illustrating a method of fabricating a semiconductor package, according to an example embodiment of the inventive concepts.

Figure 11:
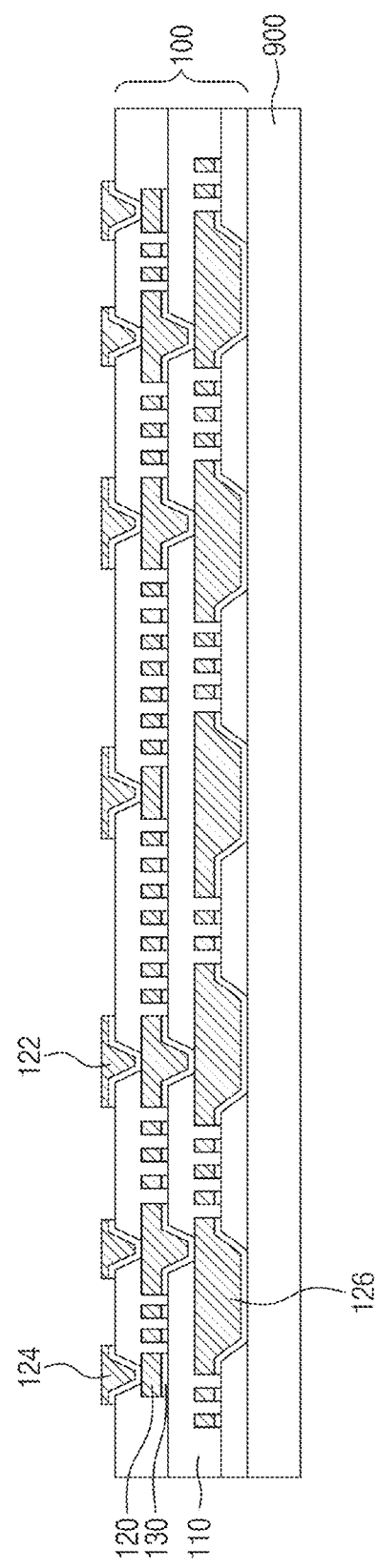
FIGS. 11 to 23 are sectional views illustrating a method of fabricating a semiconductor package, according to an example embodiment of the inventive concepts.

Referring to FIG. 11, a carrier substrate 900 may be provided. The carrier substrate 900 may be an insulating substrate, which is formed of glass or polymer, or a conductive substrate, which is formed of a metallic material. An adhesive member (not shown) may be provided on a top surface of the carrier substrate 900. As an example, the adhesive member may include an adhesive tape.

The first substrate insulating pattern 110 may be formed on the carrier substrate 900. The first substrate insulating pattern 110 may be formed by coating an insulating material on the carrier substrate 900 and curing the insulating material. The first substrate insulating pattern 110 may cover the top surface of the carrier substrate 900. The insulating material may be formed of or include a photo imageable dielectric (PID) material.

The first substrate insulating pattern 110 may be patterned to form openings. The openings may expose the top surface of the carrier substrate 900. The openings may define empty regions, in which the under-bump pads 126 will be formed.

The first substrate interconnection pattern 120 may be formed on the first substrate insulating pattern 110. For example, the first seed/barrier layer 130 may be formed on the top surface of the first substrate insulating pattern 110, a mask pattern may be formed on the first seed/barrier layer 130, and then, a plating process, in which the first seed/barrier layer 130 exposed by the mask pattern is used as a seed layer, may be performed to form the first substrate interconnection pattern 120. Thereafter, the mask pattern and the first seed/barrier layer 130 under the mask pattern may be removed.

As a result of the afore-described process, it may be possible to form a single structure (e.g., the first substrate interconnection layer) including the first substrate insulating pattern 110 and the first substrate interconnection pattern 120. The process of forming the first substrate interconnection layer may be repeated to form the lower package substrate 100, in which the first substrate interconnection layers are stacked. The first substrate interconnection pattern 120 of the uppermost one of the first substrate interconnection layers may correspond to the first substrate pads 122 and the second substrate pad 124 of the lower package substrate 100.

Figure 12:
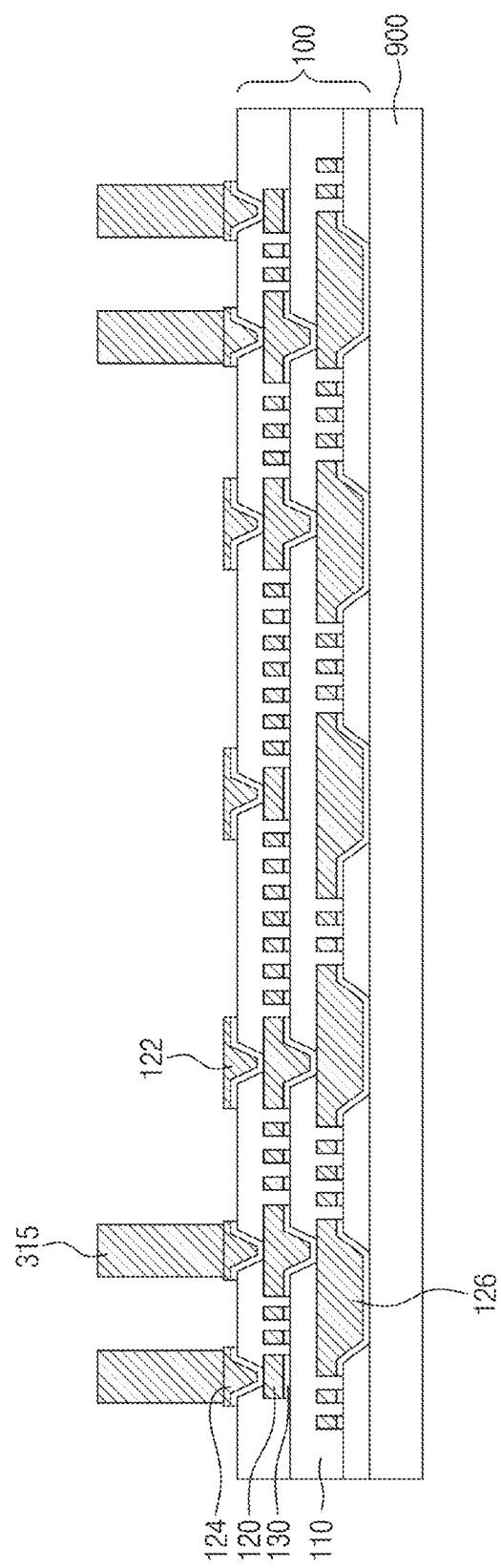

Referring to FIG. 12, the penetration electrode 315 may be formed on the lower package substrate 100. For example, a sacrificial layer may be formed on the lower package substrate 100. The sacrificial layer may cover the top surface of the lower package substrate 100. The sacrificial layer may be formed of or include, for example, a photoresist material. An etching process or a patterning process including exposing and developing steps may be performed on the sacrificial layer to form a via hole penetrating the sacrificial layer and exposing the second substrate pad 124. Thereafter, the penetration electrode 315 may be formed by filling the via hole with a conductive material. The sacrificial layer may be removed in a subsequent step. If desired, a plurality of the penetration electrodes 315 may be provided.

Figure 13:
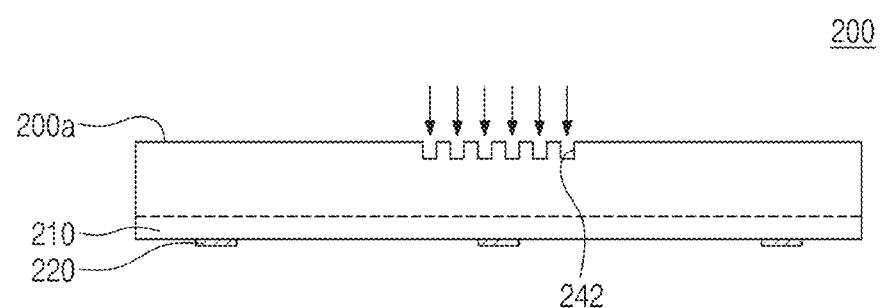

Referring to FIG. 13, the lower semiconductor chip 200 may be provided. The structure of the lower semiconductor chip 200 may be the same as or similar to that of FIG. 1. For example, the lower semiconductor chip 200 may include the first circuit layer 210, which is provided on an active surface of the lower semiconductor chip 200, and the first chip pads 220, which are connected to the first circuit layer 210.

The marking pattern 242 may be formed in the inactive surface 200a of the lower semiconductor chip 200. The marking pattern 242 may be performed by a laser patterning process using a laser beam. However, the inventive concepts are not limited to this example, and various processes may be used to form the intaglio marking pattern 242 in or on the inactive surface 200a of the lower semiconductor chip 200.

Figure 14:
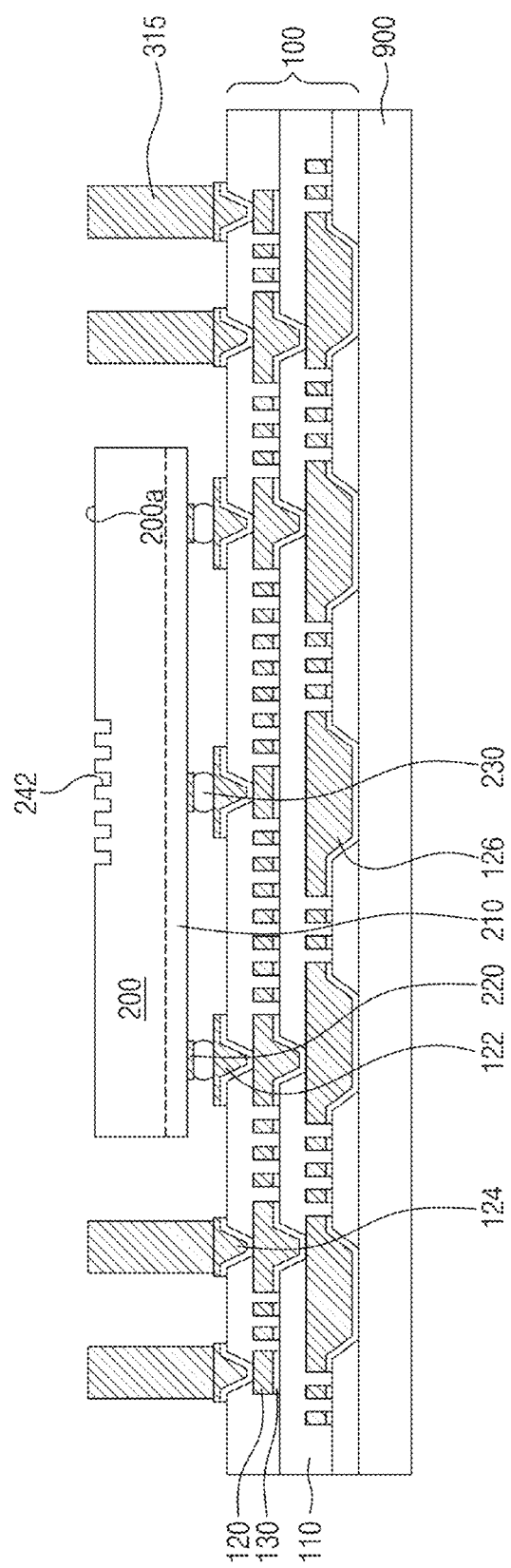

Referring to FIG. 14, the lower semiconductor chip 200 may be mounted on the lower package substrate 100. For example, the first chip terminals 230 may be provided on the first chip pads 220 of the lower semiconductor chip 200. The lower semiconductor chip 200 may be aligned such that the first chip terminals 230 are placed on the first substrate pads 122 of the lower package substrate 100, and then, a reflow process may be performed to connect the first chip terminals 230 to the first substrate pads 122. The top surface 200a of the lower semiconductor chip 200, which corresponds to the inactive surface 200a of the lower semiconductor chip 200, may be located at a level that is equal to or lower than the top surface of the penetration electrode 315.

Figure 15:
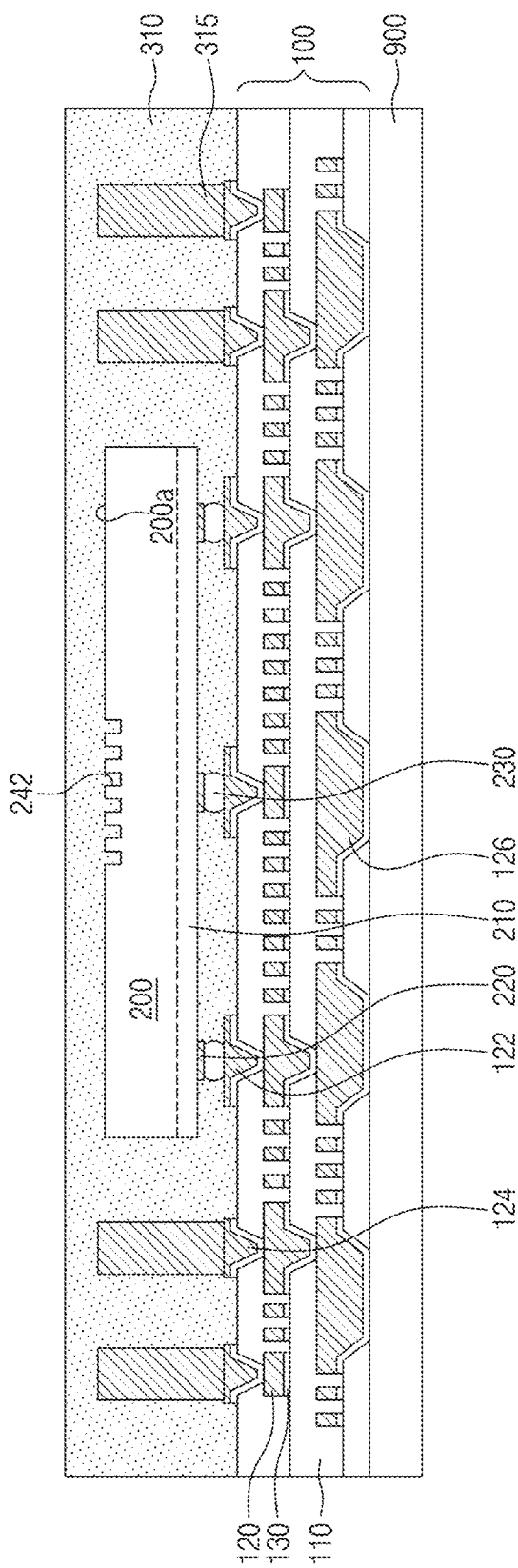

Referring to FIG. 15, the lower mold layer 310 may be formed on the lower package substrate 100. For example, a molding material may be formed on the top surface of the lower package substrate 100 to encapsulate the lower semiconductor chip 200. The molding material may be cured to form the lower mold layer 310. The lower mold layer 310 may cover the side and top surfaces of the lower semiconductor chip 200. Here, the lower mold layer 310 may fill an inner space of the marking pattern 242, which is formed in the top surface 200a of the lower semiconductor chip 200. The lower mold layer 310 may enclose the penetration electrode 315. Here, the penetration electrode 315 may be buried in the lower mold layer 310.

Figure 16:
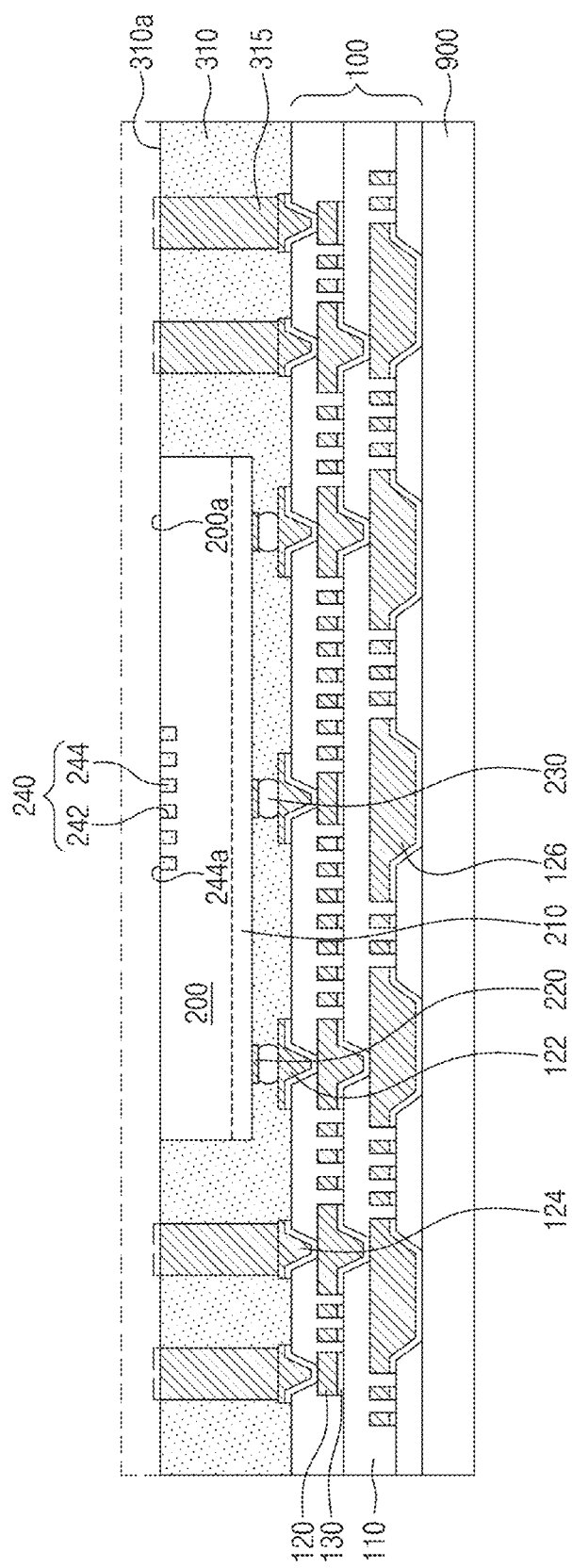

Referring to FIG. 16, the lower mold layer 310 may be partially removed. For example, the lower mold layer 310 may be thinned. For example, a grinding process or a chemical mechanical polishing (CMP) process may be performed on the top surface 310a of the lower mold layer 310. Accordingly, the top surface 310a of the lower mold layer 310 may be planarized. The thinning process may be performed to expose not only the top surface 200a of the lower semiconductor chip 200 but also the top surface of the penetration electrode 315. An upper portion of the lower mold layer 310 may be removed by the thinning process, and in an example embodiment, an upper portion of the penetration electrode 315 or an upper portion of the lower semiconductor chip 200 may also be removed by the thinning process. For example, in the case where the top surface of the penetration electrode 315 is located at a level higher than the top surface of the lower semiconductor chip 200, the upper portion of the penetration electrode 315 may be removed by the thinning process. In the case where the top surface of the lower semiconductor chip 200 is located at a level higher than the top surface of the penetration electrode 315, the upper portion of the lower semiconductor chip 200 may be removed by the thinning process. Because the thinning process is performed to expose the top surface 200a of the lower semiconductor chip 200, a portion of the lower mold layer 310 filling the marking pattern 242 may be separated from a remaining portion of the lower mold layer 310 enclosing the lower semiconductor chip 200, and the molding pattern 244 may be formed in the marking pattern 242. The marking pattern 242 and the molding pattern 244 filling the marking pattern 242 may constitute the cognition mark 240.

After the thinning process, the top surface 200a of the lower semiconductor chip 200 and the top surface of the penetration electrode 315 may be exposed. The top surface 200a of the lower semiconductor chip 200, the top surface 244a of the molding pattern 244, the top surface of the penetration electrode 315, and the top surface 310a of the lower mold layer 310 may be substantially flat and may be substantially coplanar with each other.

According to an example embodiment of the inventive concepts, because the molding pattern 244 is used as a part of the cognition mark 240, it may be possible to suppress an uneven profile issue, may occur on the top surface 200a of the lower semiconductor chip 200, and the top surfaces 200a and 244a of the lower semiconductor chip 200 and the cognition mark 240 may be formed to have an overall flat profile. Accordingly, it may be possible to easily form the redistribution layer 400 on the lower semiconductor chip 200.

Figure 17:
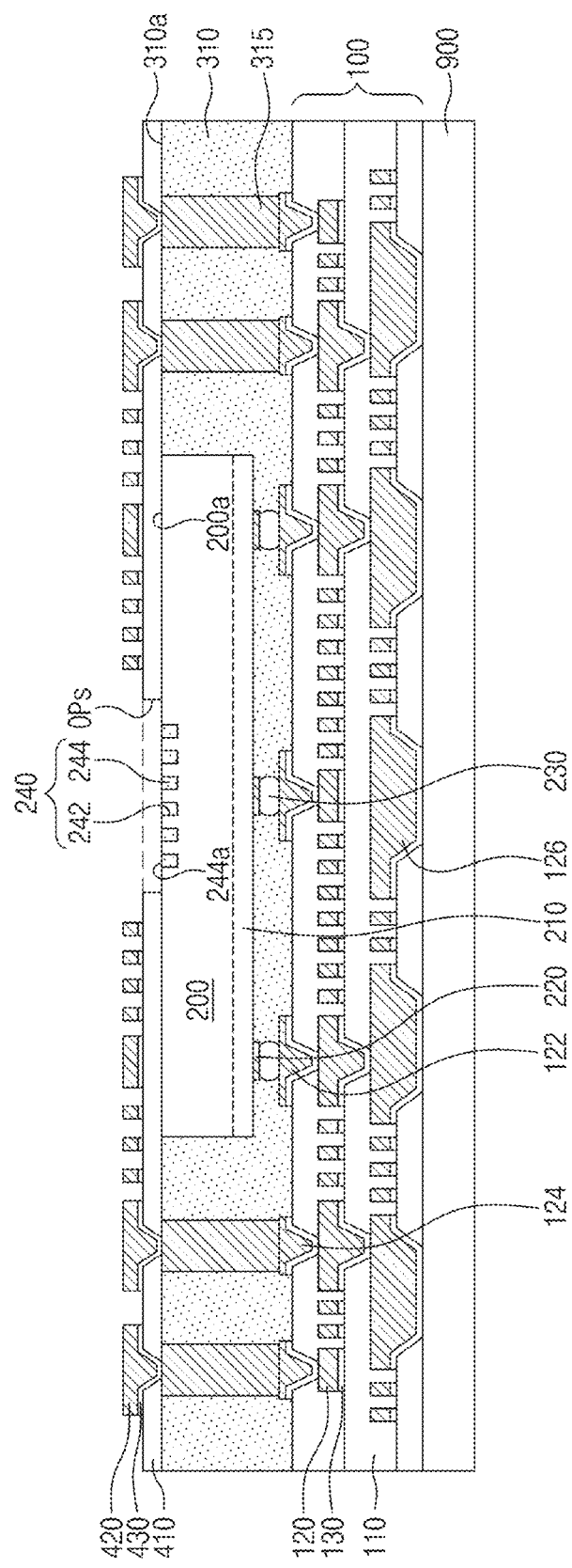

Referring to FIG. 17, the second substrate insulating pattern 410 may be formed on the lower mold layer 310. The second substrate insulating pattern 410 may be formed by coating an insulating material on the lower mold layer 310 and curing the insulating material. The second substrate insulating pattern 410 may be patterned to form the sub-opening OPs and the holes at center or central and peripheral portions thereof. The holes may be formed to expose the top surface of the penetration electrode 315. The sub-opening OPs may expose the top surface 200a of the lower semiconductor chip 200. For example, the sub-opening OPs may expose the cognition mark 240 of the lower semiconductor chip 200.

The second substrate interconnection pattern 420 may be formed on the second substrate insulating pattern 410. As an example, the second seed/barrier layer 430 may be formed on the top surface of the second substrate insulating pattern 410, a mask pattern may be formed on the second seed/barrier layer 430, and then, a plating process, in which the second seed/barrier layer 430 exposed by the mask pattern is used as a seed layer, may be performed to form the second substrate interconnection pattern 420. Thereafter, the mask pattern and a remaining portion of the second seed/barrier layer 430 under the mask pattern may be removed. The afore-described process may make it possible to form a single structure (i.e., the second substrate interconnection layer) including the second substrate insulating pattern 410 and the second substrate interconnection pattern 420.

Figure 18:
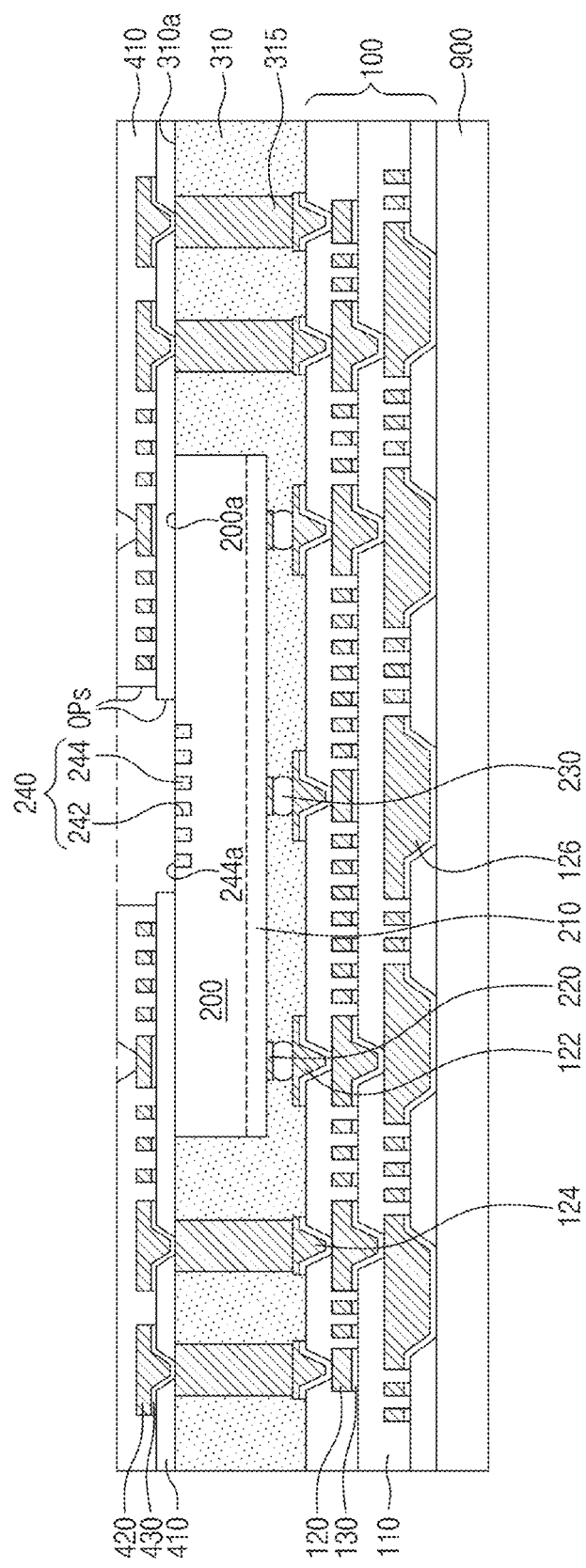
Figure 19:
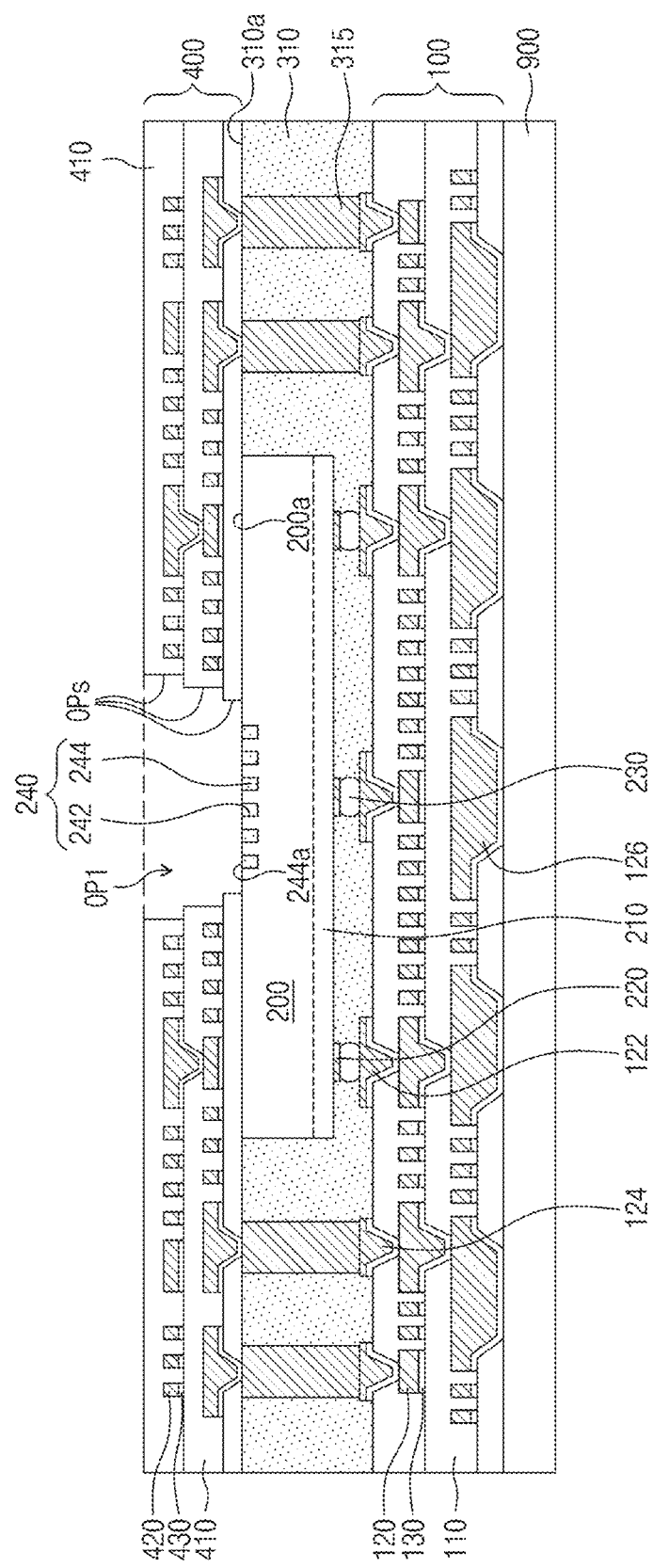

The process of forming the second substrate interconnection layer may be repeated to form the redistribution layer 400, in which the second substrate interconnection layers are stacked. Referring to FIG. 18, the second substrate insulating pattern 410 may be formed on the lowermost one of the second substrate interconnection layers. The sub-opening OPs and the holes may be formed at center or central and peripheral portions of the second substrate insulating pattern 410 by patterning the second substrate insulating pattern 410. The sub-opening OPs may be formed to expose the cognition mark 240 of the lower semiconductor chip 200. The sub-opening OPs of the second substrate insulating pattern 410, which are formed by this process, may have a width that is larger than a width of the sub-opening OPs of the second substrate insulating pattern 410 previously formed thereunder. The second substrate interconnection pattern 420 may be formed on the second substrate insulating pattern 410. Thereafter, as shown in FIG. 19, the second substrate insulating pattern 410 may be formed on the structure of FIG. 18. The second substrate insulating pattern 410 may be patterned to form the sub-opening OPs and the holes at center or central and peripheral portions thereof. The sub-opening OPs may be formed to expose the cognition mark 240 of the lower semiconductor chip 200. The sub-opening OPs of the second substrate insulating pattern 410, which is formed by this process, may have a width that is larger than a width of the sub-opening OPs of the second substrate insulating pattern 410 previously formed thereunder. The second substrate interconnection pattern 420 may be formed on the second substrate insulating pattern 410.

Because, as described above, the second substrate insulating patterns 410 are sequentially formed and the sub-openings OPs are formed through the process of forming each of the second substrate insulating patterns 410, an inner side surface of the first opening OP1, which is defined by the vertical connection of the sub-openings OPs, may have a stepwise shape.

Figure 20:
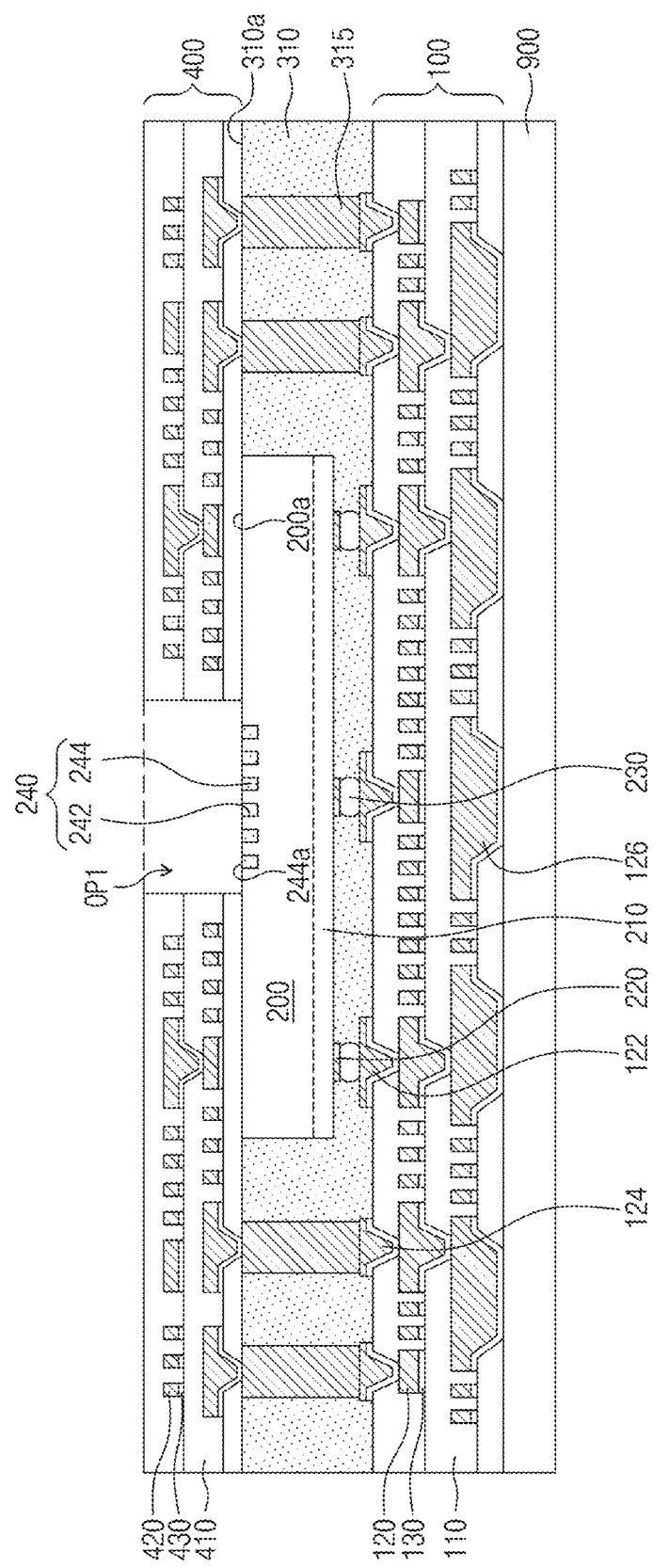

In another example embodiment, the process of forming the redistribution layer 400 may be performed such that the sub-opening OPs is not formed in each of the second substrate insulating patterns 410, as shown in FIG. 20. In this case, the redistribution layer 400 may cover the cognition mark 240. Thereafter, if desired, the first opening OP1 may be formed to vertically penetrate the second substrate insulating patterns 410 of the redistribution layer 400. Here, a width of the first opening OP1 may be substantially constant, regardless of a distance from the top surface 200a of the lower semiconductor chip 200. The following description will be given, based on the example embodiment of FIGS. 17 to 19.

Referring back to FIG. 1, the protection layer 102 may be formed on the bottom surface of the lower package substrate 100. For example, the carrier substrate 900 may be removed, and as a result, the bottom surface of the first substrate insulating pattern 110 may be exposed to the outside. The protection layer 102 may be formed by depositing an insulating material on the bottom surface of the first substrate insulating pattern 110. For example, the insulating material may include at least one of silicon oxide (SiO), silicon nitride (SiN), silicon oxynitride (SiON), or insulating polymers. Thereafter, the protection layer 102 may be patterned to expose the bottom surfaces of the under-bump pads 126.

The outer terminals 105 may be provided on the bottom surface of the lower package substrate 100. For example, the outer terminals 105 may be disposed on the under-bump pads 126, which are exposed by the protection layer 102. The outer terminals 105 may include solder balls or solder bumps.

Figure 21:
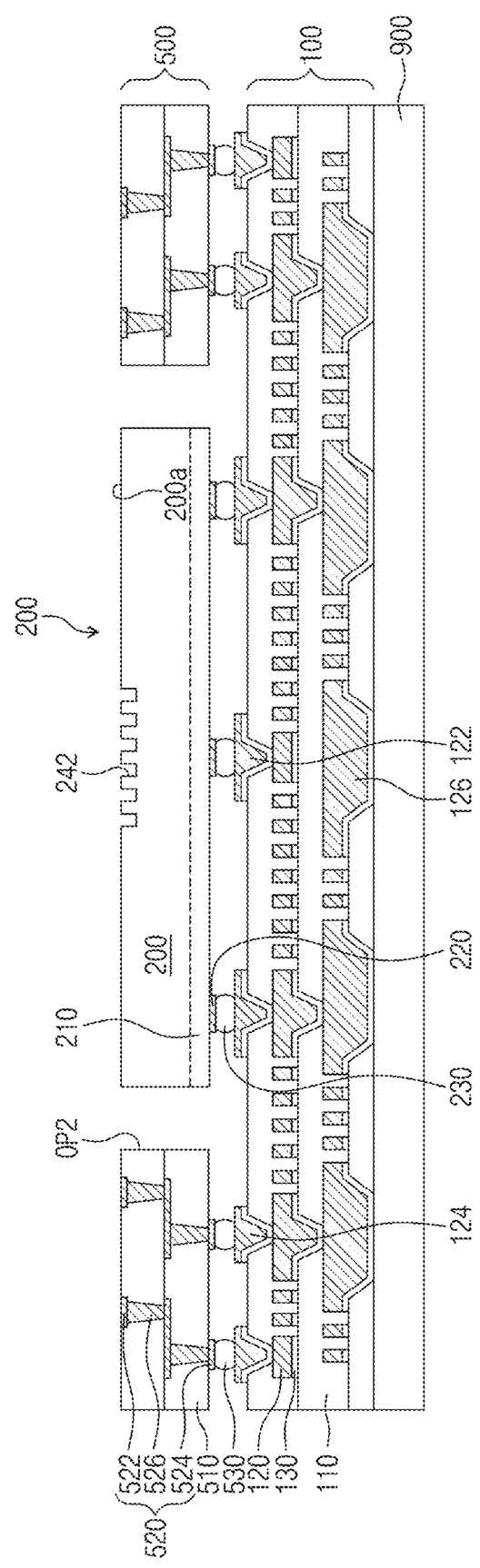
Figure 22:
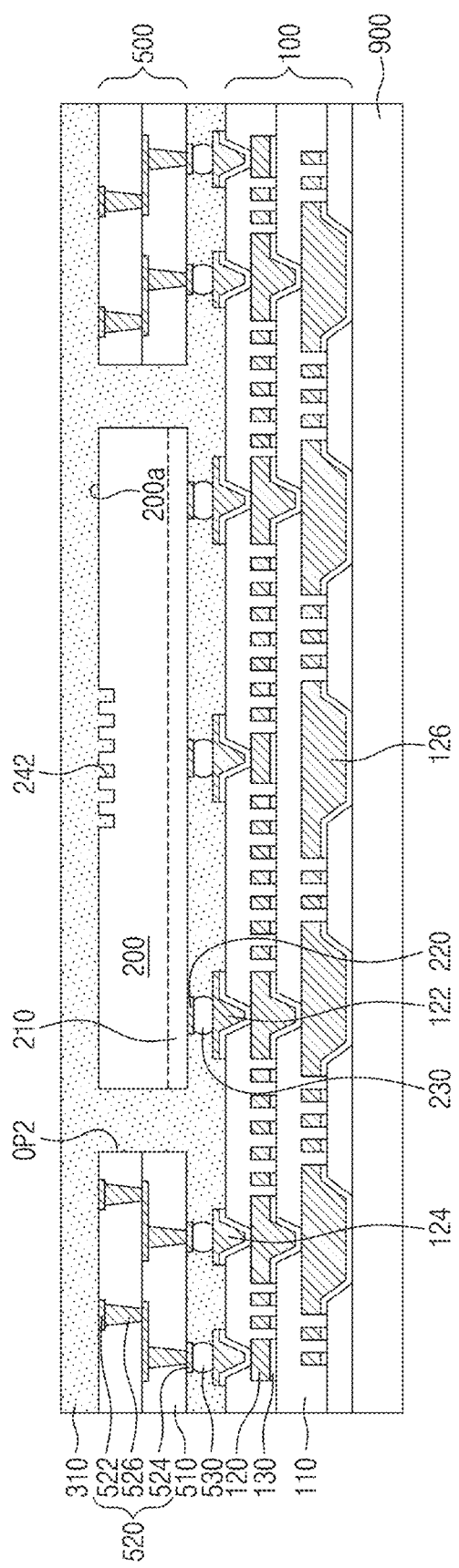
Figure 23:
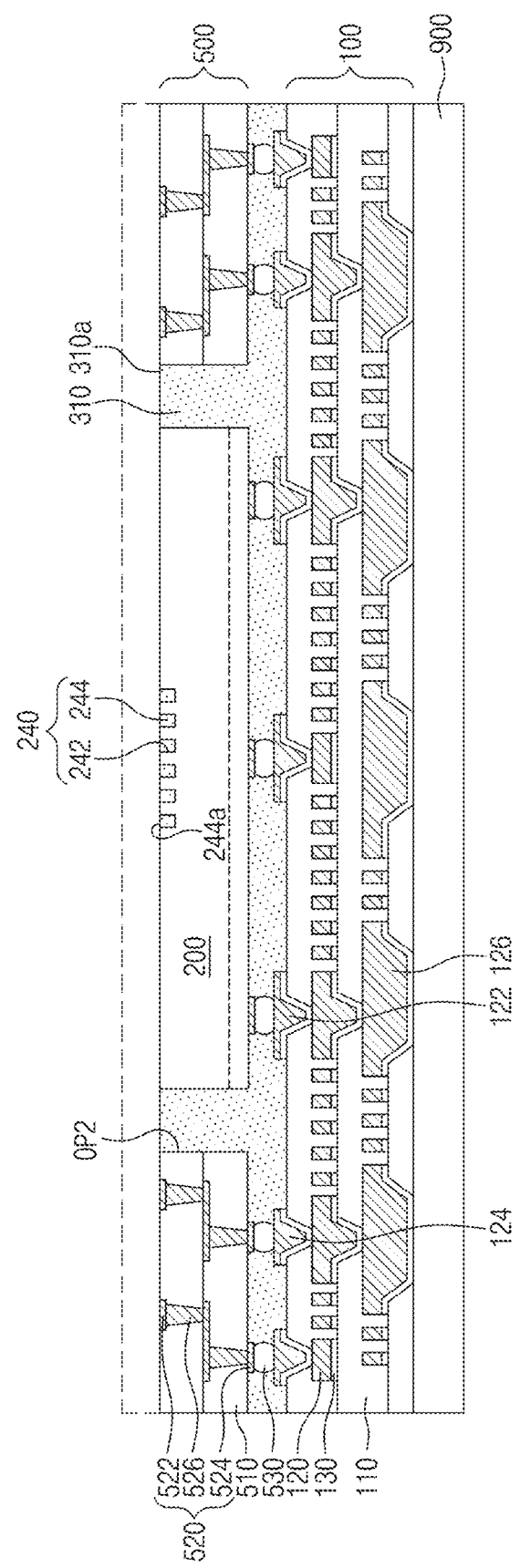

FIGS. 21 to 23 are sectional views illustrating a method of fabricating a semiconductor package, according to an example embodiment of the inventive concepts.

Referring to FIG. 21, the connection substrate 500 may be mounted on the structure of FIG. 11 (e.g., on the lower package substrate 100). The connection substrate 500 may be the same as or similar to that described with reference to FIG. 9. For example, the connection substrate 500 may have the second opening OP2, which penetrates therethrough. The connection substrate 500 may include the substrate base layer 510 and the conductive portion 520, which is provided in the substrate base layer 510 and is used as an interconnection pattern. The conductive portion 520 may be disposed in an outer region of the connection substrate 500, which is located outside the opening when viewed in a plan view. The conductive portion 520 may include the connection substrate upper pads 522, the connection substrate lower pads 524, and the connection substrate vias 526. The connection substrate upper pads 522 may be disposed in an upper portion of the connection substrate 500. The connection substrate lower pads 524 may be disposed on the bottom surface of the connection substrate 500. The connection substrate vias 526 may penetrate the substrate base layer 510 and may be electrically connected to the connection substrate upper pads 522 and the connection substrate lower pads 524.

The connection substrate 500 may be mounted on the lower package substrate 100. In an example embodiment, the connection substrate terminals 530 may be provided on the connection substrate lower pads 524. The connection substrate 500 may be aligned such that the connection substrate terminals 530 are placed on the second substrate pads 124 of the lower package substrate 100, and then a reflow process may be performed to connect the connection substrate terminals 530 to the second substrate pads 124.

The lower semiconductor chip 200 may be mounted on the lower package substrate 100. In an example embodiment, the first chip terminals 230 may be provided on the first chip pads 220 of the lower semiconductor chip 200. The lower semiconductor chip 200 may be aligned such that the first chip terminals 230 are placed on the first substrate pads 122 of the lower package substrate 100, and then a reflow process may be performed to connect the first chip terminals 230 to the first substrate pads 122. The top surface 200a of the lower semiconductor chip 200 may be located at a level that is equal to or similar to the top surface of the connection substrate 500.

Referring to FIG. 22, the lower mold layer 310 may be formed on the lower package substrate 100. For example, a molding material may be formed on the top surface of the lower package substrate 100 to encapsulate the lower semiconductor chip 200. The molding material may be cured to form the lower mold layer 310. The lower mold layer 310 may cover the side and top surfaces of the lower semiconductor chip 200. Here, the lower mold layer 310 may fill an inner space of the marking pattern 242, which is formed in the top surface 200a of the lower semiconductor chip 200. The lower mold layer 310 may be provided in the second opening OP2 of the connection substrate 500 to fill a space between the connection substrate 500 and the lower semiconductor chip 200. The lower mold layer 310 may cover the top surface of the connection substrate 500.

Referring to FIG. 23, a portion of the lower mold layer 310 may be removed. For example, the lower mold layer 310 may be thinned. For example, a grinding process or a chemical mechanical polishing (CMP) process may be performed on the top surface 310a of the lower mold layer 310. Accordingly, the top surface 310a of the lower mold layer 310 may be planarized. The thinning process may be performed to expose both of the top surface 200a of the lower semiconductor chip 200 and the top surface of the connection substrate 500. Because the thinning process is performed to expose the top surface 200a of the lower semiconductor chip 200, a portion of the lower mold layer 310 filling the marking pattern 242 may be separated from a remaining portion of the lower mold layer 310 enclosing the lower semiconductor chip 200, and the molding pattern 244 may be formed in the marking pattern 242. The marking pattern 242 and the molding pattern 244 filling the marking pattern 242 may constitute the cognition mark 240.

After the thinning process, the top surface 200a of the lower semiconductor chip 200 and the top surface of the connection substrate 500 may be exposed to the outside. The top surface 200a of the lower semiconductor chip 200, the top surface 244a of the molding pattern 244, the top surface of the connection substrate 500, and the top surface 310a of the lower mold layer 310 may be substantially flat and may be substantially coplanar with each other.

Thereafter, the redistribution layer 400 may be formed using the process described with reference to FIGS. 17 to 20. For example, the second substrate insulating pattern 410 may be formed on the lower mold layer 310, and then the sub-opening OPs and the holes may be formed at center or central and peripheral portions of the second substrate insulating pattern 410 by patterning the second substrate insulating pattern 410. The holes may be formed to expose the top surfaces of the connection substrate upper pads 522 of the connection substrate 500. The sub-opening OPs may expose the cognition mark 240 of the lower semiconductor chip 200. The second substrate interconnection pattern 420 may be formed on the second substrate insulating pattern 410. Furthermore, the second seed/barrier layer 430 may be formed on the top surface of the second substrate insulating pattern 410, a mask pattern may be formed on the second seed/barrier layer 430, and then, a plating process, in which the second seed/barrier layer 430 exposed by the mask pattern is used as a seed layer, may be performed to form the second substrate interconnection pattern 420. Thereafter, the mask pattern and a portion of the second seed/barrier layer 430 under the mask pattern may be removed. The aforedescribed process may make it possible to form a single structure (e.g., the second substrate interconnection layer) including the second substrate insulating pattern 410 and the second substrate interconnection pattern 420, and the redistribution layer 400 may be formed by repeating the aforedescribed process.

Referring back to FIG. 1, the protection layer 102 may be formed on the bottom surface of the lower package substrate 100. For example, the carrier substrate 900 may be removed, and as a result, the bottom surface of the first substrate insulating pattern 110 may be exposed to the outside. The protection layer 102 may be formed by depositing an insulating material on the bottom surface of the first substrate insulating pattern 110. Thereafter, the protection layer 102 may be patterned to expose the bottom surfaces of the under-bump pads 126.

The outer terminals 105 may be provided on the bottom surface of the lower package substrate 100. For example, the outer terminals 105 may be disposed on the under-bump pads 126 exposed by the protection layer 102.

According to an example embodiment of the inventive concepts, a semiconductor package may include a cognition mark including a marking pattern, which is formed in an intaglio manner on a lower semiconductor chip, and a molding pattern, which fills an inner space of the intaglio marking pattern. The cognition mark may be recognized, based on a difference in color between the molding pattern and the lower semiconductor chip, and this may make it possible to improve visibility of the cognition mark.

Furthermore, a top surface of the lower semiconductor chip may be coplanar with a top surface of the molding pattern. In other words, an uneven profile, which is formed on the top surface of the lower semiconductor chip by the marking pattern, may be compensated by the molding pattern, and thus, the lower semiconductor chip and the cognition mark may have substantially flat top surfaces. Accordingly, in a subsequent step, it may be possible to easily form a redistribution layer on the lower semiconductor chip.

Further, an opening may be formed in the redistribution layer to expose the cognition mark, an interconnection pattern of the redistribution layer may not veil the cognition mark, or an insulating pattern may be formed of a transparent material. Accordingly, when the semiconductor package is viewed from the top, the cognition mark may not be veiled by the redistribution layer, and this may make it possible to further improve the visibility of the cognition mark.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
   a lower substrate;
   a lower semiconductor chip on the lower substrate;
   a lower mold layer on the lower substrate, the lower mold layer enclosing the lower semiconductor chip;
   a redistribution layer on the lower mold layer; and
   a vertical connection terminal around the lower semiconductor chip, the vertical connection terminal connecting the lower substrate to the redistribution layer,
   wherein the lower semiconductor chip comprises a cognition mark at a top surface of the lower semiconductor chip,
   the cognition mark comprises,
      a marking pattern at the top surface of the lower semiconductor chip and having an intaglio shape, and
      a molding pattern filling an inner space of the marking pattern,
   a first material constituting the molding pattern is same as a second material constituting the lower mold layer, and
   a top surface of the molding pattern and the top surface of the lower lower semiconductor chip are coplanar.

2. The semiconductor package of claim 1, wherein the molding pattern and the lower mold layer comprise an epoxy molding compound.

3. The semiconductor package of claim 1, wherein:
   the redistribution layer comprises a first opening vertically penetrating therethrough; and
   the first opening is on the lower semiconductor chip and exposes the cognition mark.

4. The semiconductor package of claim 3, wherein:
   the redistribution layer comprises,
      insulating patterns vertically stacked on each other, and
      interconnection patterns being in the insulating patterns, respectively, as horizontal interconnection lines, and electrically connected to each other; and
   an inner side surface of the first opening has a stepwise shape including a plurality of steps, each of which is defined by a corresponding one of the insulating patterns.

5. The semiconductor package of claim 1, wherein:
   the redistribution layer comprises,
      an insulating pattern, and
      an interconnection pattern being in the insulating pattern, the interconnection pattern serving as a horizontal interconnection line, and coupled to the vertical connection terminal;
   the redistribution layer is on the lower mold layer to fully cover the lower semiconductor chip; and
   the insulating pattern comprises a transparent material.

6. The semiconductor package of claim 5, wherein the interconnection pattern is outside the cognition mark, when viewed in a plan view.

7. The semiconductor package of claim 5, wherein the insulating pattern comprises a transparent photo imageable dielectric (PID) material.

8. The semiconductor package of claim 1, wherein the top surface of the lower semiconductor chip is coplanar with a top surface of the lower mold layer.

9. The semiconductor package of claim 1, wherein the first material constituting the molding pattern has a different color from the top surface of the lower semiconductor chip.

10. A semiconductor package, comprising:
    a substrate;
    a semiconductor chip on the substrate;
    a mold layer on the substrate, the mold layer enclosing the semiconductor chip;
    a redistribution layer on the mold layer; and
    a penetration electrode around the semiconductor chip, the penetration electrode connecting the substrate to the redistribution layer,
    wherein the semiconductor chip comprises a cognition mark at a top surface of the semiconductor chip,
    the cognition mark comprises,
       a marking pattern at the top surface of the semiconductor chip, a top surface of the marking pattern being at a level different from the top surface of the semiconductor chip, and
       a molding pattern being on the semiconductor chip and exposing the marking pattern, and
    a topmost surface of the semiconductor chip is coplanar with a top surface of the molding pattern, and
    wherein the marking pattern comprises an intaglio region, which is recessed from the top surface of the semiconductor chip toward an inner portion of the semiconductor chip,
    the molding pattern fills the intaglio region, and
    the topmost surface of the semiconductor chip is at a same level as the top surface of the molding pattern.

11. The semiconductor package of claim 10, wherein a first material constituting the molding pattern is same as a second material constituting the mold layer.

12. The semiconductor package of claim 10, wherein:
the redistribution layer has an opening vertically penetrating therethrough; and
the opening is on the semiconductor chip and exposes the cognition mark.

13. The semiconductor package of claim 12, wherein:
the redistribution layer comprises,
- insulating patterns vertically stacked on each other, and
- interconnection patterns being in the insulating patterns, respectively, the interconnection patterns serving as horizontal interconnection lines and electrically connected to each other; and an inner side surface of the opening has a stepwise shape including a plurality of steps, each of which is defined by a corresponding one of the insulating patterns.

14. The semiconductor package of claim 10, wherein:
the redistribution layer comprises,
- an insulating pattern, and
- an interconnection pattern being in the insulating pattern as a horizontal interconnection line and coupled to the penetration electrode, the redistribution layer is on the mold layer and fully covers the semiconductor chip, and
the insulating pattern comprises a transparent material.

15. The semiconductor package of claim 14, wherein the interconnection pattern is outside the cognition mark, when viewed in a plan view.

16. The semiconductor package of claim 10, wherein the topmost surface of the semiconductor chip is coplanar with a top surface of the mold layer.

\* \* \* \* \*